(12) United States Patent
Kang et al.

(10) Patent No.: US 12,016,224 B2
(45) Date of Patent: Jun. 18, 2024

(54) DISPLAY PANEL, AND DISPLAY DEVICE INCLUDING THE SAME

(71) Applicant: SAMSUNG DISPLAY CO., LTD., Yongin-si (KR)

(72) Inventors: Taewook Kang, Yongin-si (KR); Kyeongsu Ko, Yongin-si (KR); Sanggab Kim, Yongin-si (KR); Wooyong Sung, Yongin-si (KR); Joongeol Lee, Yongin-si (KR); Shinil Choi, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 17/821,463

(22) Filed: Aug. 22, 2022

(65) Prior Publication Data

US 2022/0399432 A1    Dec. 15, 2022

Related U.S. Application Data

(63) Continuation of application No. 17/156,444, filed on Jan. 22, 2021, now Pat. No. 11,424,315, which is a
(Continued)

(30) Foreign Application Priority Data

Sep. 12, 2018   (KR) ........................ 10-2018-0109179

(51) Int. Cl.
*H10K 59/131* (2023.01)
*H10K 50/82* (2023.01)
(Continued)

(52) U.S. Cl.
CPC .......... *H10K 59/131* (2023.02); *H10K 50/82* (2023.02); *H10K 50/84* (2023.02); *H10K 59/00* (2023.02); *H10K 59/10* (2023.02); *H10K 59/124* (2023.02)

(58) Field of Classification Search
None
See application file for complete search history.

(56) References Cited

U.S. PATENT DOCUMENTS 8,278,223 B2   10/2012   Kang
8,456,586 B2   6/2013   Mathew et al.
(Continued)

FOREIGN PATENT DOCUMENTS

JP   2017-10055 A   1/2017
KR   10-0510455 B1   10/2005
(Continued)

*Primary Examiner* — Eduardo A Rodela
(74) *Attorney, Agent, or Firm* — Lewis Roca Rothgerber Christie LLP

(57) ABSTRACT

A display panel including a glass substrate having an opening area, and a display area at least partially surrounding the opening area; a thin film transistor on the display area including a semiconductor layer and a gate electrode; a display element electrically connected to the thin film transistor; a multi-layer including an insulating layer and a lower insulating layer. The insulating layer is between the glass substrate and the display element and the lower insulating layer is between the glass substrate and the insulating layer; and a thin-film encapsulation layer covering the display element including an inorganic encapsulation layer and an organic encapsulation layer. The multi-layer includes a first groove between the opening area and the display area. A first width of a portion of the first groove in the lower insulating layer is greater than a second width of a portion of the first groove in the insulating layer.

22 Claims, 25 Drawing Sheets

Related U.S. Application Data continuation of application No. 16/510,686, filed on Jul. 12, 2019, now Pat. No. 10,916,588.

(51) Int. Cl.
  *H10K 50/84* (2023.01)
  *H10K 59/00* (2023.01)
  *H10K 59/10* (2023.01)
  *H10K 59/124* (2023.01)

(56) References Cited

U.S. PATENT DOCUMENTS

| | | | |
|---|---|---|---|
| 8,869,738 | B2 | 10/2014 | Shin et al. |
| 9,406,905 | B2 | 8/2016 | Park et al. |
| 9,632,487 | B2 | 4/2017 | Kim et al. |
| 9,818,807 | B2 | 11/2017 | Park |
| 9,894,781 | B2 | 2/2018 | Franklin et al. |
| 9,905,629 | B2 | 2/2018 | Kim et al. |
| 10,191,577 | B2 | 1/2019 | Choi et al. |
| 10,199,602 | B2 | 2/2019 | Choi et al. |
| 10,205,122 | B2 | 2/2019 | Choi et al. |
| 10,454,067 | B2 * | 10/2019 | Seo .................. H10K 50/856 |
| 10,505,145 | B2 | 12/2019 | Lee et al. |
| 10,541,380 | B1 * | 1/2020 | Sung .................. H10K 59/124 |
| 10,840,478 | B2 * | 11/2020 | Han .................. H10K 59/1216 |
| 10,916,588 | B2 * | 2/2021 | Kang .................. H10K 59/00 |
| 11,063,238 | B2 | 7/2021 | Lee et al. |
| 2015/0144934 | A1 | 5/2015 | Rappoport et al. |
| 2017/0033312 | A1 | 2/2017 | Kim et al. |
| 2017/0148856 | A1 * | 5/2017 | Choi .................. H10K 59/124 |
| 2018/0069063 | A1 | 3/2018 | Kim et al. |
| 2018/0090722 | A1 | 3/2018 | Kim et al. |
| 2019/0051859 | A1 | 2/2019 | Choi et al. |
| 2019/0081129 | A1 | 3/2019 | Sung et al. |
| 2019/0081273 | A1 | 3/2019 | Sung et al. |
| 2019/0123298 | A1 | 4/2019 | Kanaya |
| 2019/0131378 | A1 | 5/2019 | Sung et al. |
| 2019/0148672 | A1 | 5/2019 | Seo et al. |
| 2019/0173048 | A1 | 6/2019 | Sung et al. |
| 2019/0245159 | A1 | 8/2019 | Kim et al. |
| 2019/0363266 | A1 | 11/2019 | Tanaka |
| 2020/0020752 | A1 | 1/2020 | Shi et al. |
| 2020/0083475 | A1 | 3/2020 | Kang et al. |
| 2020/0106045 | A1 | 4/2020 | Han et al. |
| 2020/0119304 | A1 * | 4/2020 | Choi .................. H10K 59/88 |
| 2020/0258957 | A1 | 8/2020 | Kwak et al. |

FOREIGN PATENT DOCUMENTS

| | | |
|---|---|---|
| KR | 10-0552834 B1 | 2/2006 |
| KR | 10-1093561 B1 | 12/2011 |
| KR | 10-2012-0062191 A | 6/2012 |
| KR | 10-2012-0066493 A | 6/2012 |
| KR | 10-2014-0137950 A | 12/2014 |
| KR | 10-2016-0064373 A | 6/2016 |
| KR | 10-2016-0087982 A | 7/2016 |
| KR | 10-2016-0108800 A | 9/2016 |
| KR | 10-2017-0015632 A | 2/2017 |
| KR | 10-2017-0036447 A | 4/2017 |
| KR | 10-2017-0059864 A | 5/2017 |
| KR | 10-2017-0063326 A | 6/2017 |
| KR | 10-2017-0096565 A | 8/2017 |
| KR | 10-2017-0115177 A | 10/2017 |
| KR | 10-2017-0128742 A | 11/2017 |
| KR | 10-2017-0135587 A | 12/2017 |
| KR | 10-2018-0026599 A | 3/2018 |
| KR | 10-2018-0034746 A | 4/2018 |
| KR | 10-2018-0062155 A | 6/2018 |
| KR | 10-2018-0064601 A | 6/2018 |
| KR | 10-2019-0018120 A | 2/2019 |
| KR | 10-2019-0029830 A | 3/2019 |
| KR | 10-2019-0029860 A | 3/2019 |
| KR | 10-2019-0049963 A | 5/2019 |
| KR | 10-2019-0056473 A | 5/2019 |
| KR | 10-2019-0066648 A | 6/2019 |
| TW | 201403170 A | 1/2014 |
| TW | 201804610 A | 2/2018 |

* cited by examiner

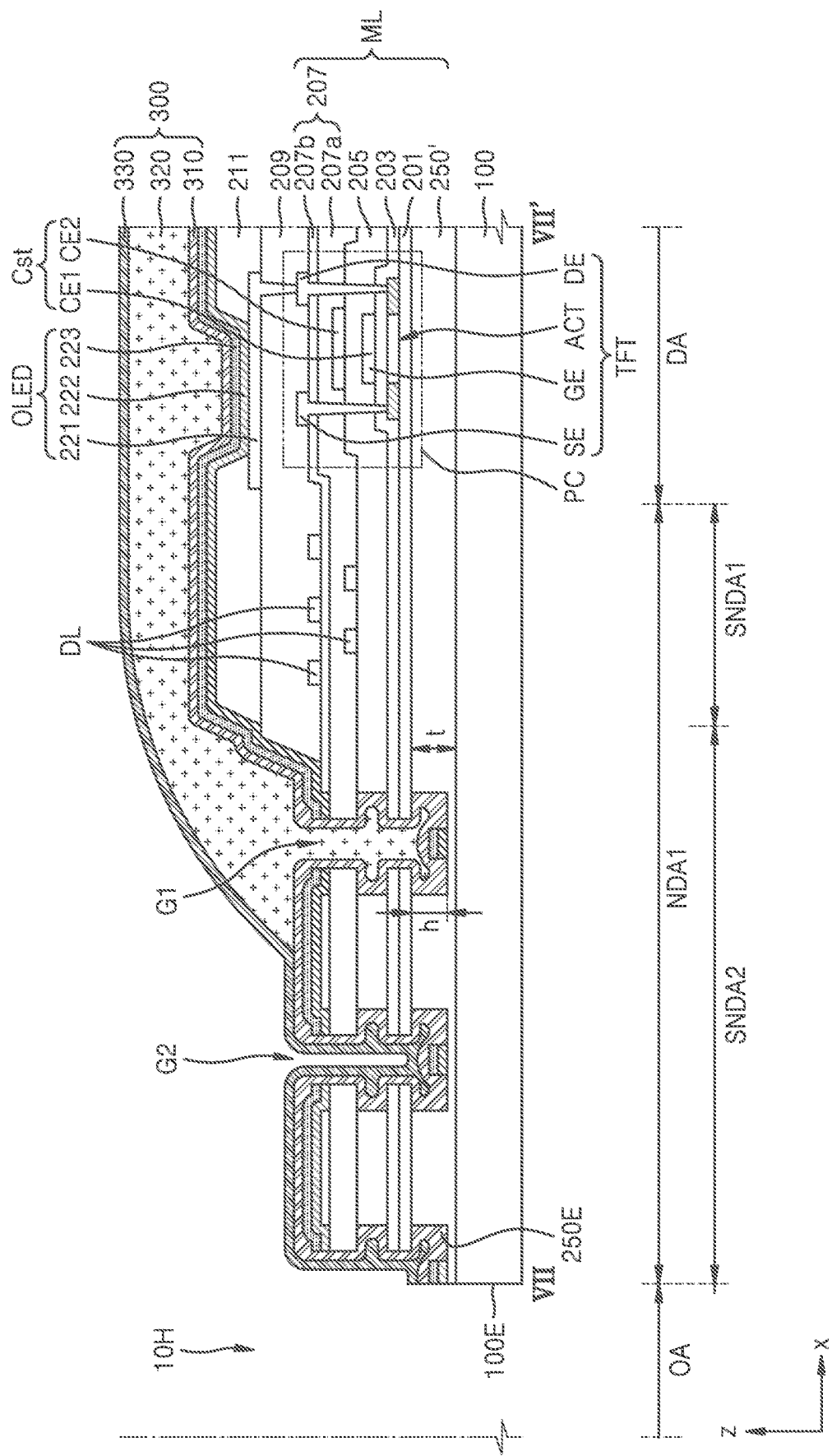

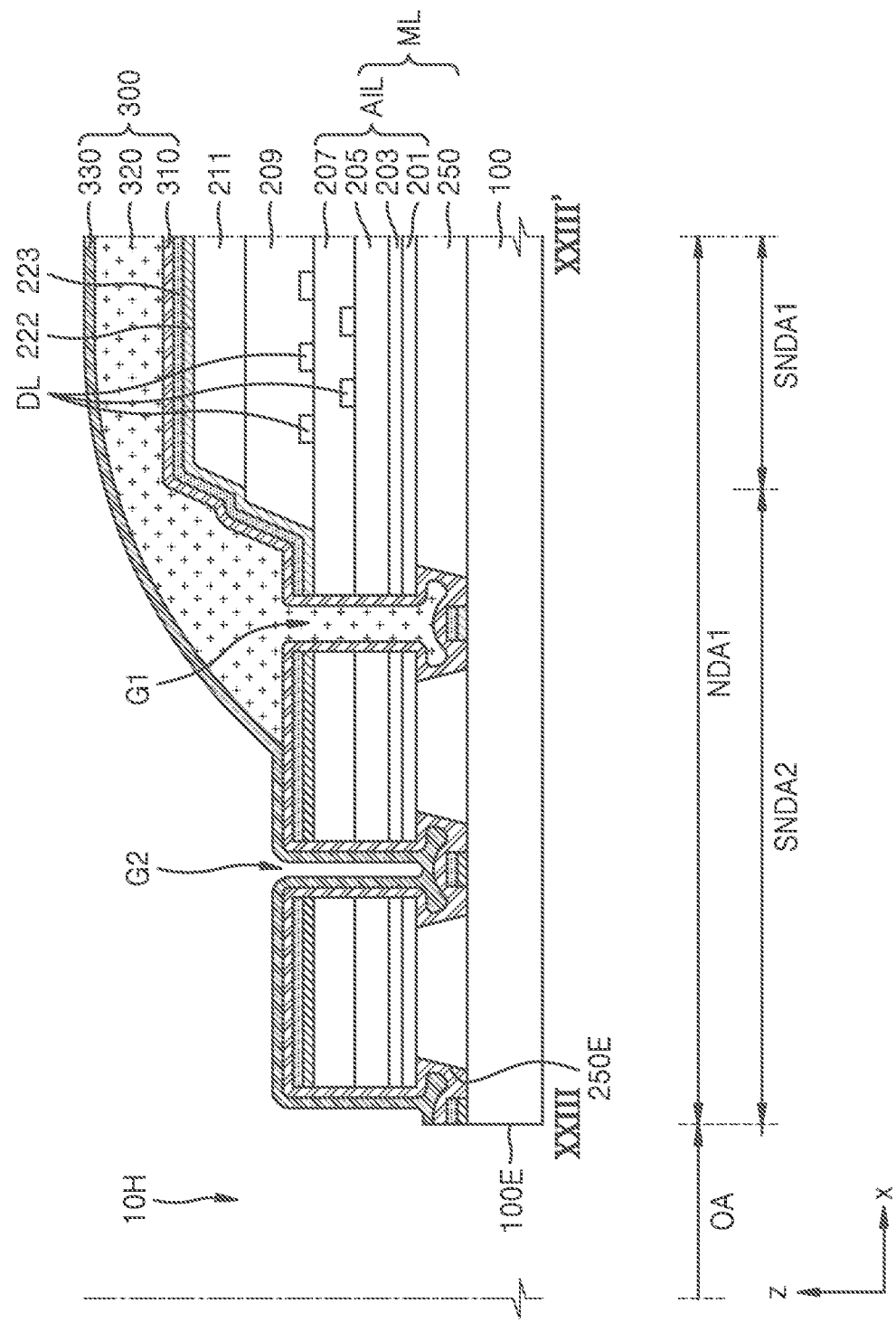

DISPLAY PANEL, AND DISPLAY DEVICE INCLUDING THE SAME

CROSS-REFERENCE TO RELATED PATENT APPLICATIONS

This application is a continuation of U.S. patent application Ser. No. 17/156,444, filed Jan. 22, 2021, which is a continuation of U.S. patent application Ser. No. 16/510,686, filed Jul. 12, 2019, now U.S. Pat. No. 10,916,588, which claims priority to and the benefit of Korean Patent Application No. 10-2018-0109179, filed Sep. 12, 2018, the entire content of all of which is incorporated herein by reference.

BACKGROUND

1. Field

One or more embodiments relate to a display panel and a display device including the display panel.

2. Description of the Related Art

Related art display devices have a diverse range of uses. Additionally, due to their relatively small thickness and light weight, their range of applications has also increased.

While a display area of a display device has increased, various functions connected or linked to the display device have been added to the display device. As a method of adding various functions while increasing the display area, a display device in which an area connected or linked to the functions is formed in the display area has been developed.

SUMMARY

In a display device including an opening, a layer(s) including an organic material and exposed via a lateral surface of the opening provides a moisture-infiltrating path, and thus display elements that at least partially surround the opening may be damaged.

One or more embodiments include a display panel capable of preventing infiltration of moisture via an opening of the display panel, and a display device including the display panel. However, the one or more embodiments are only examples, and the scope of the present invention is not limited thereto.

Additional aspects will be set forth in part in the description which follows and, in part, will be apparent from the description, or may be learned by practice of the presented embodiments.

According to one or more embodiments, a display panel includes a glass substrate including an opening area, and a display area at least partially surrounding the opening area; a thin film transistor on the display area and including a semiconductor layer and a gate electrode; a display element electrically connected to the thin film transistor; a multi-layer including at least one insulating layer and a lower insulating layer, wherein the at least one insulating layer is between the glass substrate and the display element and the lower insulating layer is between the glass substrate and the at least one insulating layer; and a thin-film encapsulation layer covering the display element and including at least one inorganic encapsulation layer and at least one organic encapsulation layer, wherein the multi-layer includes a first groove located between the opening area and the display area, and a first width of a portion of the first groove in the lower insulating layer is greater than a second width of a portion of the first groove in the at least one insulating layer.

A bottom surface of the first groove may be on a virtual surface in between an upper surface of the lower insulating layer and an upper surface of the glass substrate or on a same virtual surface as the upper surface of the glass substrate.

The at least one insulating layer may include a first hole corresponding to the first groove, and the lower insulating layer may include a second hole or recess corresponding to the first groove.

A lateral surface of the at least one insulating layer facing a center of the first groove is closer to the center of the first groove than a lateral surface of the lower insulating layer facing the center of the first groove. The lower insulating layer may be in direct contact with an upper surface of the glass substrate.

The at least one inorganic encapsulation layer may cover an inner surface of the first groove.

A portion of the at least one inorganic encapsulation layer may be in direct contact with a portion of the glass substrate within the first groove.

The glass substrate may include a first opening corresponding to the opening area.

An end of the glass substrate that defines the first opening i closer to a center of the opening area than an end of the lower insulating layer facing the opening area.

The multi-layer may further include a second groove between the first groove and the opening area.

An end of the at least one organic encapsulation layer may be between the first groove and the second groove.

The display panel may further include a partition wall on the multi-layer and located between the first groove and the second groove.

The lower insulating layer may include an organic insulating layer and the at least one insulating layer may include an inorganic insulating layer.

The lower insulating layer may include at least one of silicon nitride and silicon oxycarbide, and the at least one insulating layer may include an inorganic insulating layer that includes a different material from the lower insulating layer.

According to one or more embodiments, a display device includes a substrate including an opening; a thin film transistor on a display area of the substrate, the display area at least partially surrounding the opening, and including a semiconductor layer and a gate electrode; a display element electrically connected to the thin film transistor; a multi-layer including a lower insulating layer and at least one insulating layer, wherein the lower insulating layer is located on the substrate and the at least one insulating layer is located on the lower insulating layer and includes a different material from the lower insulating layer; and an encapsulation layer configured to cover the display element, wherein the multi-layer includes a first groove that is concave in a depth direction of the multi-layer, and a width of a portion of the first groove in the lower insulating layer is greater than a width of a portion of the first groove in the at least one insulating layer.

The substrate may include a glass material, a polymer material, or a metal material.

A bottom surface of the first groove may be on a virtual surface in between an upper surface of the lower insulating layer and an upper surface of the substrate or on a same virtual surface as the upper surface of the substrate.

The at least one insulating layer may include a first hole corresponding to the first groove, and the lower insulating layer may include a second hole or recess corresponding to the first groove.

The at least one insulating layer may include an inorganic insulating layer.

The lower insulating layer may include an organic insulating layer or may include an inorganic insulating layer that is different from the at least one insulating layer.

A lateral surface of the at least one insulating layer directed toward a center of the first groove may protrude farther than a lateral surface of the lower insulating layer directed toward the center of the first groove.

An end of the substrate directed toward the opening may protrude toward the opening farther than an end of the lower insulating layer directed toward the opening.

The multi-layer may further include a second groove between the first groove and the opening.

The encapsulation layer may include at least one inorganic encapsulation layer and at least one organic encapsulation layer, and the at least one inorganic encapsulation layer may cover an inner surface of each of the first groove and the second groove.

A portion of the at least one organic encapsulation layer may at least partially fill the first groove.

The display device may further include a partition wall on the multi-layer and located between the first groove and the second groove.

The at least one inorganic encapsulation layer may be in direct contact with an upper surface of the substrate within the first groove or the second groove.

The at least one insulating layer may include a first insulating layer and a second insulating layer on the first insulating layer, the first and second insulating layers including different materials. The first insulating layer and the second insulating layer may include holes corresponding to the first groove, respectively, and a width of the hole of the second insulating layer may be less than a width of the hole of the first insulating layer.

The display element may include an organic light-emitting diode.

At least one of an organic layer and an opposite electrode included in the organic light-emitting diode may be disconnected by the first groove.

BRIEF DESCRIPTION OF THE DRAWINGS

These and/or other aspects will become apparent and more readily appreciated from the following description of the embodiments, taken in conjunction with the accompanying drawings in which:

FIG. 16 is a cross-sectional view of a display panel according to another embodiment;

FIG. 23 is a cross-sectional view of the display panel of FIG. 22.

DETAILED DESCRIPTION

Figure 1:
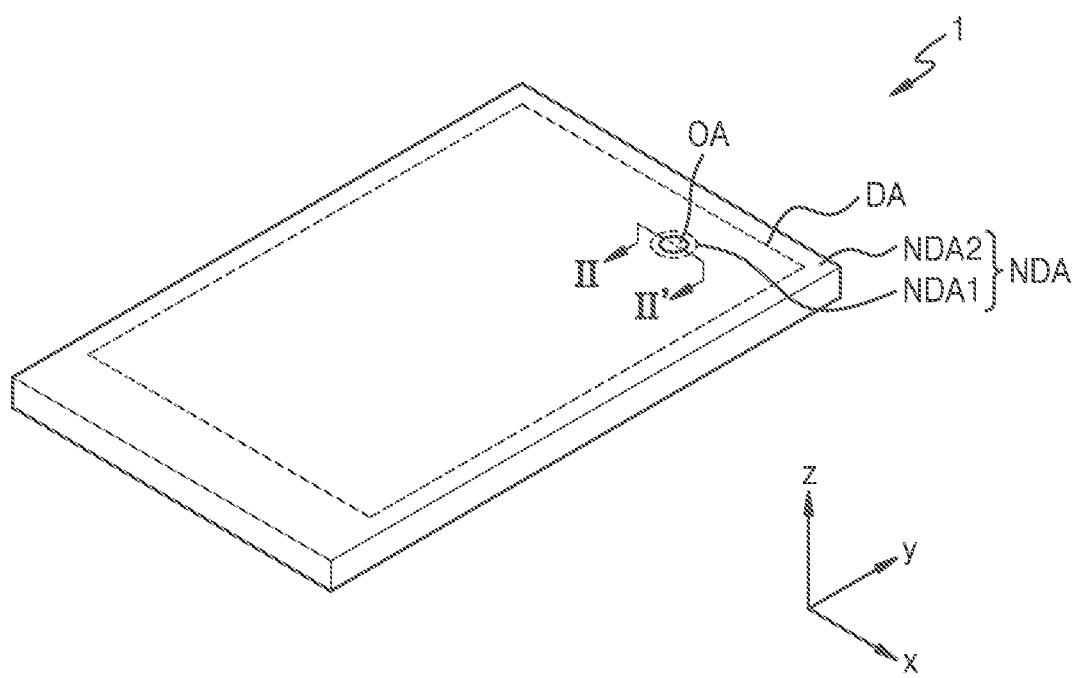
FIG. 1 is a schematic perspective view of a display device according to an embodiment.

As the disclosure allows for various changes and numerous embodiments, particular embodiments will be illustrated in the drawings and described in detail in the written description. Hereinafter, effects and features of the present disclosure and a method for accomplishing them will be described more fully with reference to the accompanying drawings, in which embodiments of the disclosure are shown. This disclosure may, however, be embodied in many different forms and should not be construed as limited to the embodiments set forth herein.

One or more embodiments of the disclosure will be described below in more detail with reference to the accompanying drawings. Those components that are the same or are in correspondence are rendered the same reference numeral regardless of the figure number, and redundant explanations are omitted.

It will be understood that although the terms "first", "second", etc. may be used herein to describe various components, these components should not be limited by these terms. These components are only used to distinguish one component from another.

As used herein, the singular forms "a", "an" and "the" are intended to include the plural forms as well, unless the context clearly indicates otherwise.

It will be further understood that the terms "comprises" and/or "comprising" used herein specify the presence of stated features or components, but do not preclude the presence or addition of one or more other features or components.

It will be understood that when a layer, region, or component is referred to as being "formed on" another layer, region, or component, it can be directly or indirectly formed on the other layer, region, or component. That is, for example, intervening layers, regions, or components may be present.

Sizes of elements in the drawings may be exaggerated for convenience of explanation. In other words, since sizes and thicknesses of components in the drawings are arbitrarily illustrated for convenience of explanation, the following embodiments are not limited thereto.

When a certain embodiment may be implemented differently, a specific process order may be performed differently from the described order. For example, two consecutively described processes may be performed substantially at the same time or performed in an order opposite to the described order.

It will also be understood that when a layer, region, or component is referred to as being "connected" or "coupled" to another layer, region, or component, it can be directly connected or coupled to the other layer, region, or component or intervening layers, regions, or components may be present. For example, when a layer, region, or component is referred to as being "electrically connected" or "electrically coupled" to another layer, region, or component, it can be directly electrically connected or coupled to the other layer, region, or component or intervening layers, regions, or components may be present.

FIG. 1 is a schematic perspective view of a display device 1 according to an embodiment of the present disclosure.

Referring to FIG. 1, the display device 1 includes a display area DA that emits light and a non-display area NDA that does not emit light. The display device 1 may provide an image by using light emitted from a plurality of pixels arranged in the display area DA.

The display device 1 includes an opening area OA at least partially surrounded by the display area DA. FIG. 1 illustrates that the opening area OA is entirely surrounded by the display area DA. The non-display area NDA may include a first non-display area NDA1 surrounding the opening area OA, and a second non-display area NDA2 surrounding the display area DA. The first non-display area NDA1 may entirely surround the opening area OA, the display area DA may entirely surround the first non-display area NDA1, and the second non-display area NDA2 may entirely surround the display area DA.

Although an organic light-emitting display device will now be illustrated and described as the display device 1, the display device 1 is not limited thereto. According to another embodiment, various types of display devices, such as an inorganic light-emitting display and a quantum dot light-emitting display, may be used.

FIGS. 2A to 2D are schematic cross-sectional views of the display device 1 according to embodiments, and may correspond to cross-sections taken along a line II-II' of FIG. 1. The opening area OA is located between two pixels. For example, the opening area OA is located between two OLEDs.

Figure 2A:
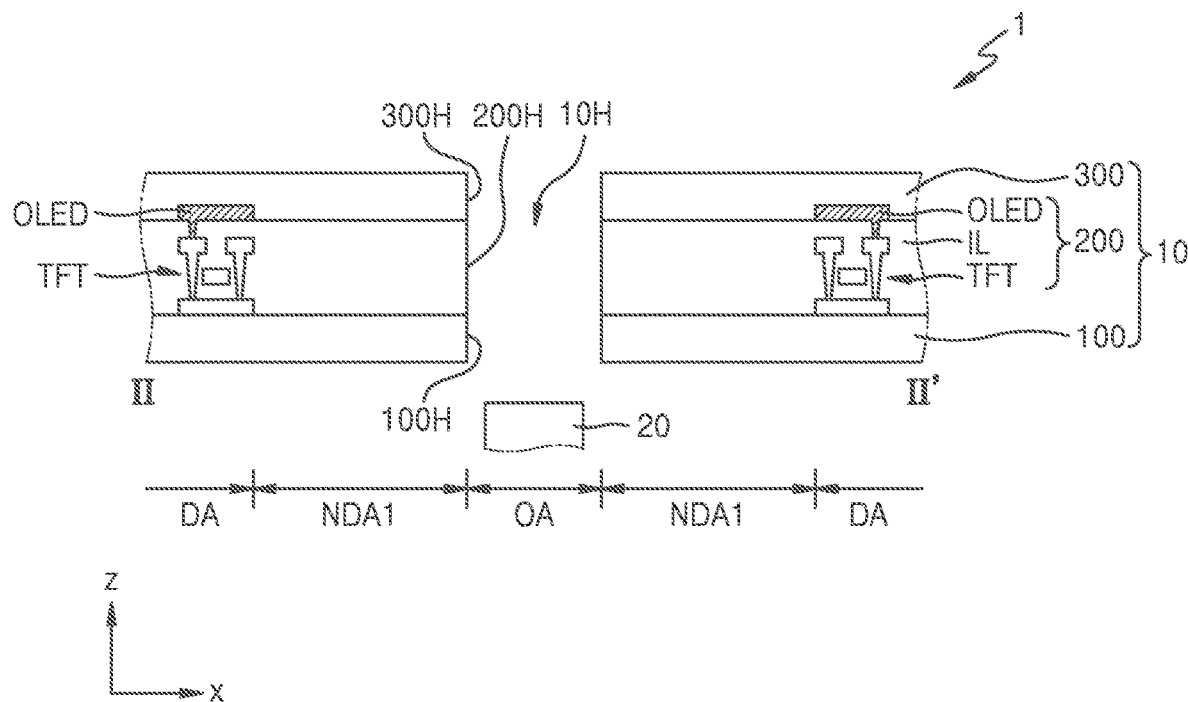
FIGS. 2A through 2D are schematic cross-sectional views of the display device according to embodiments.

Referring to FIG. 2A, the display device 1 may include a display panel 10 and a component 20 corresponding to the opening area OA of the display panel 10. Although not shown, an element (s) such as an input sensing member for sensing a touch input, an anti-reflection member including a polarizer and a retarder, or a color filter and a black matrix, and a transparent window may be arranged on the display panel 10.

The display panel 10 may include a substrate 100, a display element layer 200 disposed on the substrate 100, and a thin-film encapsulation layer 300 as an encapsulation member that covers the display element layer 200.

The substrate 100 may includes a glass material, polymer material, or a metal material. The substrate 100 may be rigid or flexible. For example, the substrate 100 may be a transparent glass substrate containing $SiO_2$ as a main component, or a substrate including a polymer resin such as reinforced plastic. The display element layer 200 includes a pixel circuit including a thin film transistor (TFT) arranged on the display area DA, and a display element, such as an organic light-emitting diode (OLED) electrically connected to the pixel circuit. The thin-film encapsulation layer 300 may prevent external moisture or contaminated materials from infiltrating into the display element layer 200, by covering the display element layer 200. The thin-film encapsulation layer 300 may include at least one inorganic encapsulation layer and at least one organic encapsulation layer.

As shown in FIG. 2A, the display panel 10 may include an opening 10H that corresponds to the opening area OA and penetrates (e.g., completely penetrates through) the display panel 10. The substrate 100, the display element layer 200, and the thin-film encapsulation layer 300 may include first through third openings 100H, 200H, and 300H corresponding to the opening area OA, respectively, and the first through third openings 100H, 200H, and 300H may together form the opening 10H of the display panel 10. The first opening 100H may penetrate from a top surface to a bottom surface of the substrate 100, the second opening 200H may penetrate from a lowermost layer to an uppermost layer of the display element layer 200, and the third opening 300H may penetrate through the thin-film encapsulation layer 300.

The opening area OA is an area in which a component 20 is located (e.g., at least a portion of the component 20 is laterally aligned with the opening 10H in the display panel 10). Although the component 20 is arranged below the substrate 100 in FIG. 2A, embodiments are not limited thereto. According to another embodiment, as shown in FIG. 2B, the component 20 may be arranged within the opening 10H such that at least a portion of the component 20 overlaps, in a thickness direction of the display panel 10, a lateral surface of the display panel 10 that faces the opening 10H (e.g., in one or more embodiments, at least a portion of the component may extend into the opening 10H in the display panel 10).

The component 20 may include an electronic element. For example, the component 20 may be an electronic element that uses light or sounds. For example, the electronic element may include a sensor that emits and/or receives and uses light, like an infrared sensor, a camera that receives light and captures an image, a sensor that outputs and senses light or sound to measure a distance or recognize a fingerprint or the like, a small lamp that outputs light, or a speaker that outputs sound. An electronic element using light may use light in various wavelength bands, such as visible light, infrared light, and ultraviolet light. According to some embodiments, the opening area OA may be understood as a transmission area capable of transmitting light or/and sound that is output from the component 20 to the outside or travels from the outside toward the component 20.

According to an embodiment, when the display panel 10 is used as a smart watch or an instrument panel for automobiles, the component 20 may be a member including a needle of a clock or a needle or the like indicating predetermined information (e.g. a velocity of a vehicle, etc.). As shown in FIG. 2A or 2B, the component 20 is a component that may be arranged at a location corresponding to the opening 10H of the display panel 10. As described above, the component 20 may include an element(s) related to a function of the display panel 10 or an element such as an accessory that increases an esthetic sense of the display panel 10.

Figure 2B:
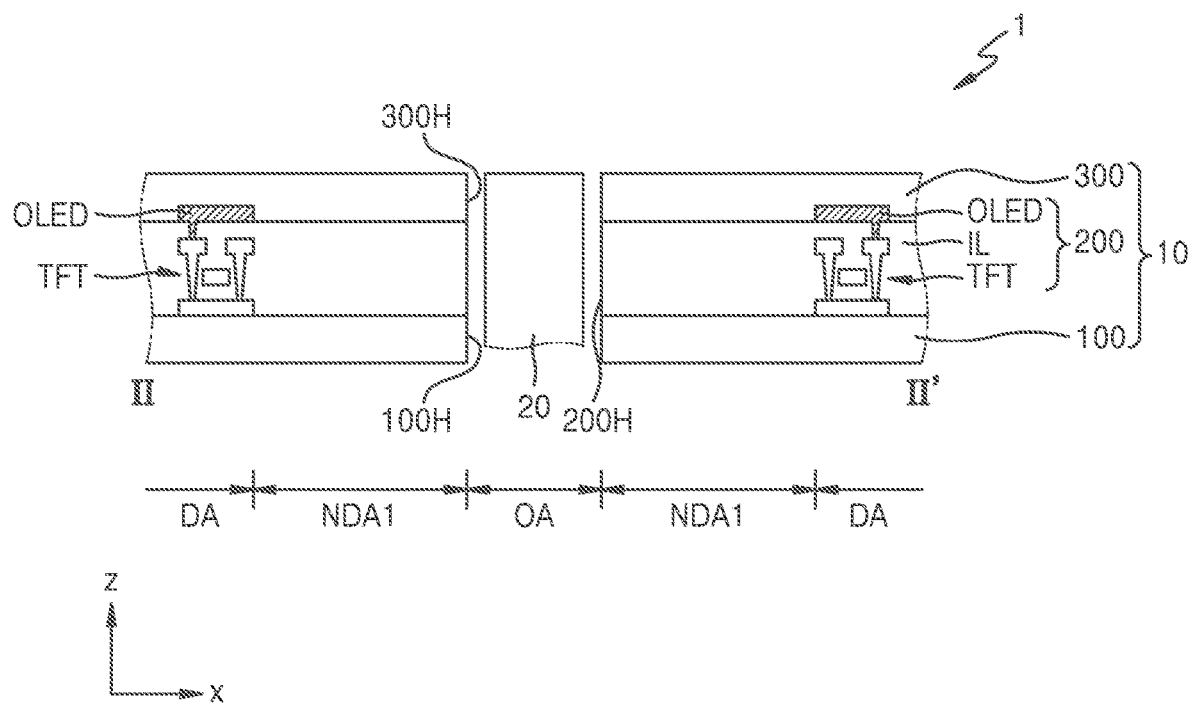

In FIGS. 2A and 2B, the substrate 100, the display element layer 200, and the thin-film encapsulation layer 300 include the first through third openings 100H, 200H, and 300H corresponding to the opening area OA, respectively. However, as shown in FIG. 2C, the substrate 100 may not include the first opening 100H.

Figure 2C:
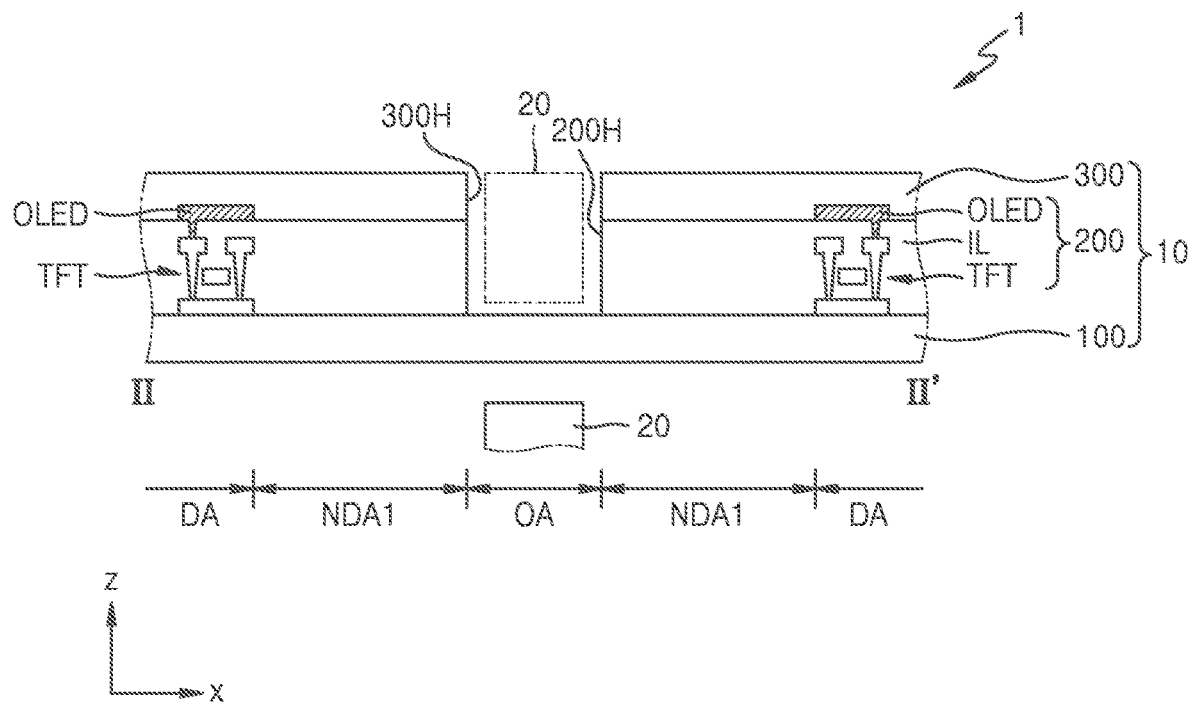

Referring to FIG. 2C, although the substrate 100 does not include the first opening 100H, the display element layer 200 and the thin-film encapsulation layer 300 may include the second and third openings 200H and 300H, respectively. According to an embodiment, a light transmittance in the opening area OA of the display panel 10 shown in FIG. 2C may be about 50% or greater, 70% or greater, 75% or greater, 80% or greater, 85% or greater, or 90% or greater.

The component 20 is arranged in the opening area OA. As shown in a solid line of FIG. 2C, the component 20 may be arranged below the display panel 10 such that the component 20 does not overlap the lateral surface of the display panel 10 that faces the opening 10H, or as shown in a dotted line of FIG. 2C, at least a portion of the component 20 may be arranged within the second and third openings 200H and 300H such that the component 20 overlaps, in a thickness direction of the display element layer 200 and the thin-film encapsulation layer 300, the lateral surface of the display panel 10 that faces the opening 10H.

Figure 2D:
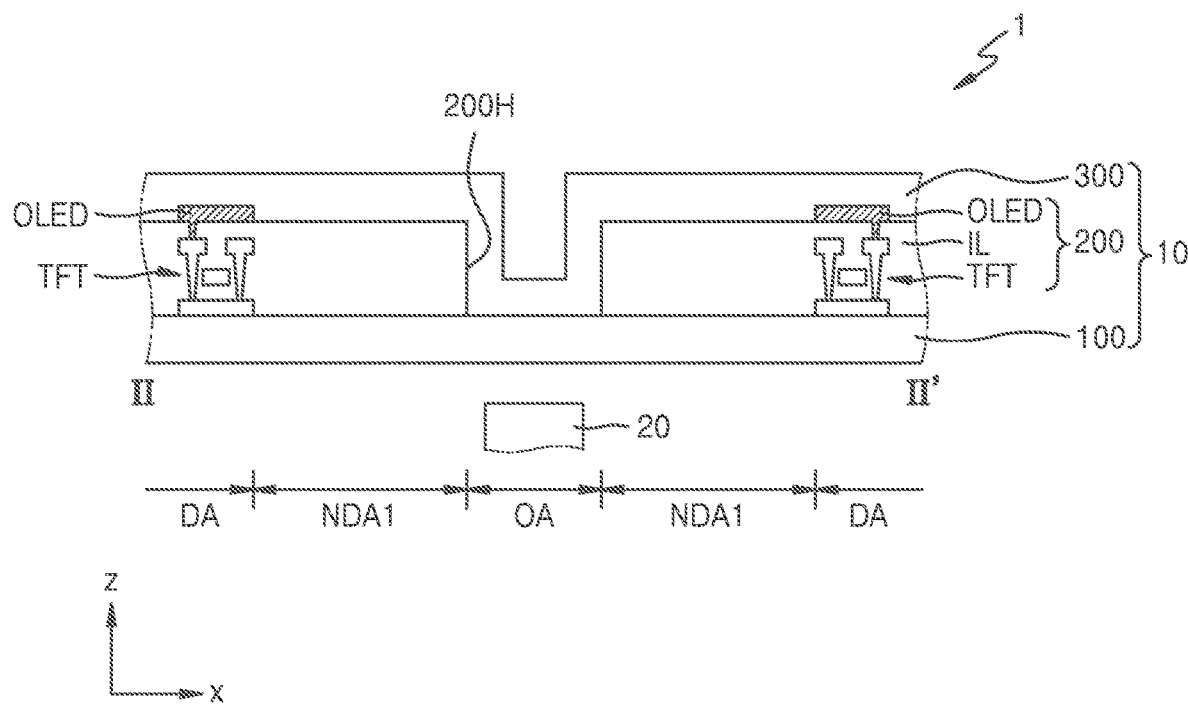

Referring to FIG. 2D, the substrate 100 and the thin-film encapsulation layer 300 may not include the first opening 100H and the third opening 300H, respectively, but the display element layer 200 may include the second opening 200H. Additionally, in the embodiment of FIG. 2D, the thin-film encapsulation layer 300 may include a recessed portion that extends along the lateral surfaces of the display element layer 200 facing the opening 10H and an upper surface of the substrate 100 facing the opening 10H. In FIG. 2D, the component 20 is arranged in the opening area OA such that the component 20 does not overlap the lateral surface of the display panel 10 that faces the opening 10H. However, the component 20 may be arranged at the location indicated by the dotted line of FIG. 2C.

Figure 3:
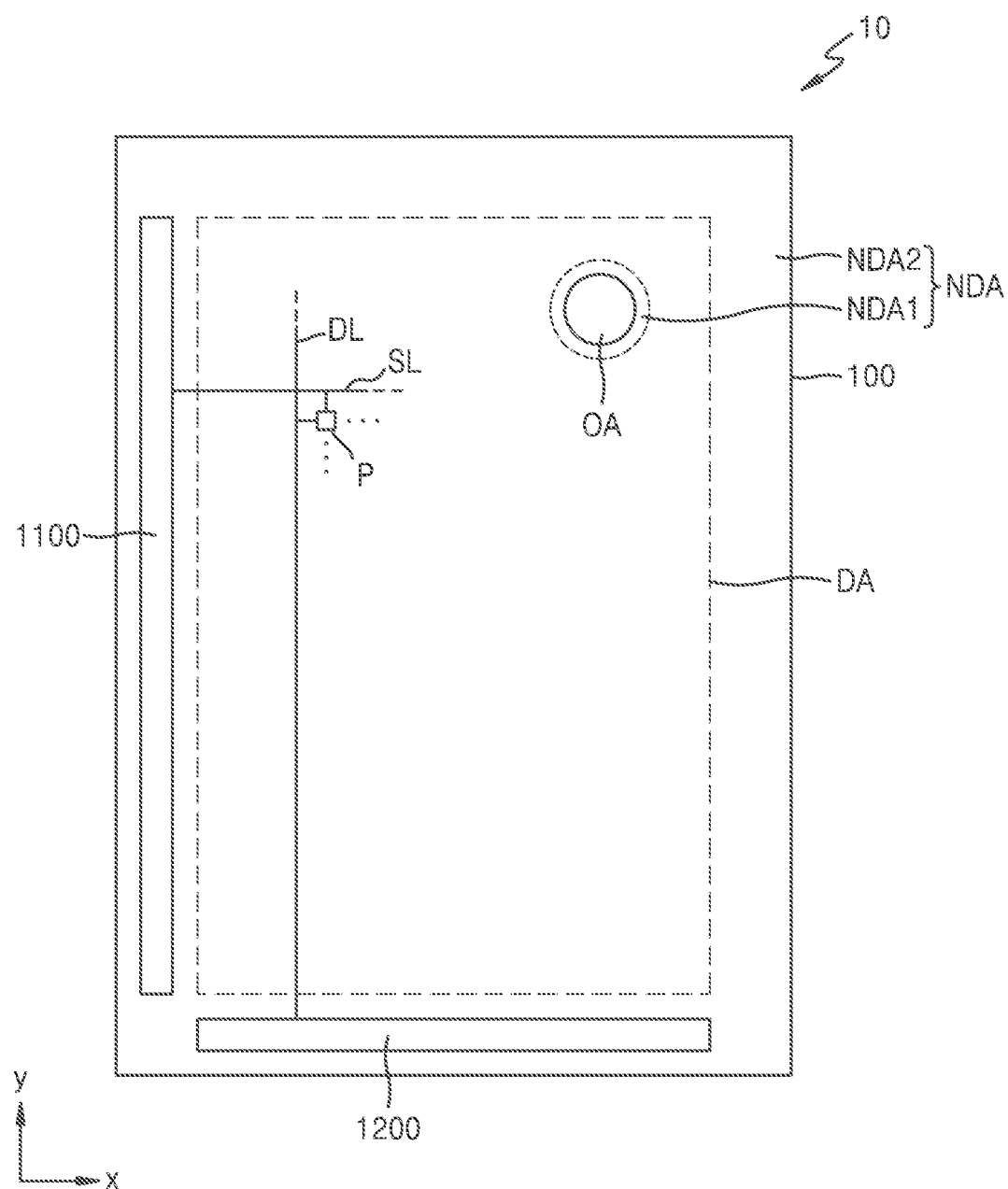
FIG. 3 is a schematic plan view of a display panel according to an embodiment.
Figure 4:
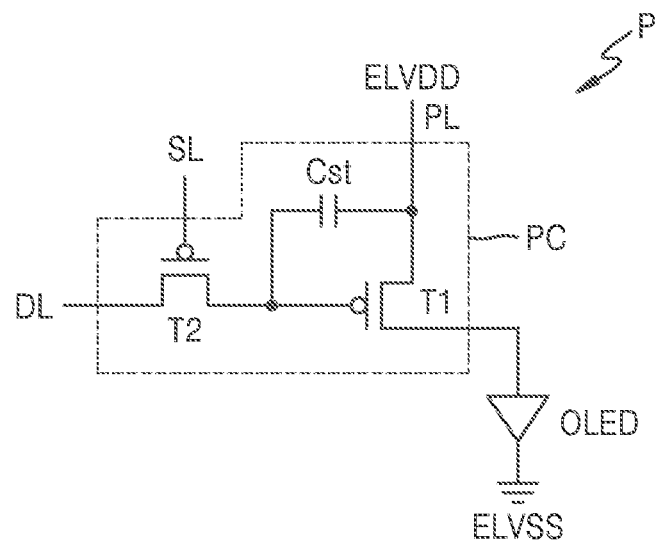
FIG. 4 is a circuit diagram of one of a plurality of pixels of the display panel.

FIG. 3 is a schematic plan view of a display panel 10 according to an embodiment, and FIG. 4 is a circuit diagram of one of a plurality of pixels of the display panel 10.

Referring to FIG. 3, the display panel 10 includes a plurality of pixels P arranged in the display area DA. Each of the pixels P may include an OLED. Each of the pixels P may emit, for example, red light, green light, blue light, or white light, via the OLED.

Referring to FIG. 4, the pixel P includes a pixel circuit PC and an OLED connected to the pixel circuit PC. The pixel circuit PC may include a first TFT T1, a second TFT T2, and a storage capacitor Cst.

The second TFT T2, which is a switching TFT, is connected to a scan line SL and a data line DL, and transmits, to the first TFT T1, a data voltage received via the data line DL according to a switching voltage received via the scan line SL. The storage capacitor Cst is connected to the second TFT T2 and a driving voltage line PL, and stores a voltage corresponding to a difference between a voltage received from the second TFT T2 and a first power supply voltage ELVDD supplied to the driving voltage line PL.

The first TFT T1, which is a driving TFT, is connected to the driving voltage line PL and the storage capacitor Cst, and may control a driving current flowing from the driving voltage line PL to the OLED, in accordance with a voltage value stored in the storage capacitor Cst. The OLED may emit light having a certain brightness by the driving current. An opposite electrode (for example, a cathode) of the OLED may receive a second power supply voltage ELVSS.

Although a case where the pixel circuit PC includes two TFTs and one storage capacitor is illustrated in FIG. 4, embodiments are not limited thereto. The number of TFTs and the number of storage capacitors may vary according to a design of the pixel circuit PC.

Referring back to FIG. 3, the first non-display area NDA1 may surround the opening area OA. The first non-display area NDA1 is an area in which a display element that emits light is not arranged. Wires, e.g., signal lines, connected to the pixels P arranged around the opening area OA may extend across the first non-display area NDA1, or a groove(s) described below may be arranged in the first non-display area NDA1. In the second non-display area NDA2, a scan driver 1100 that provides a scan signal to each of the pixels P, a data driver 1200 that provides a data signal to each of the pixels P, and a main power wire (not shown) for providing first and second power supply voltages may be arranged.

FIG. 3 may be understood as a figure of the substrate 100 of the display panel 10. For example, the substrate 100 may be understood as including the opening area OA, the display area DA, and the first and second non-display areas NDA1 and NDA2.

Figure 5:
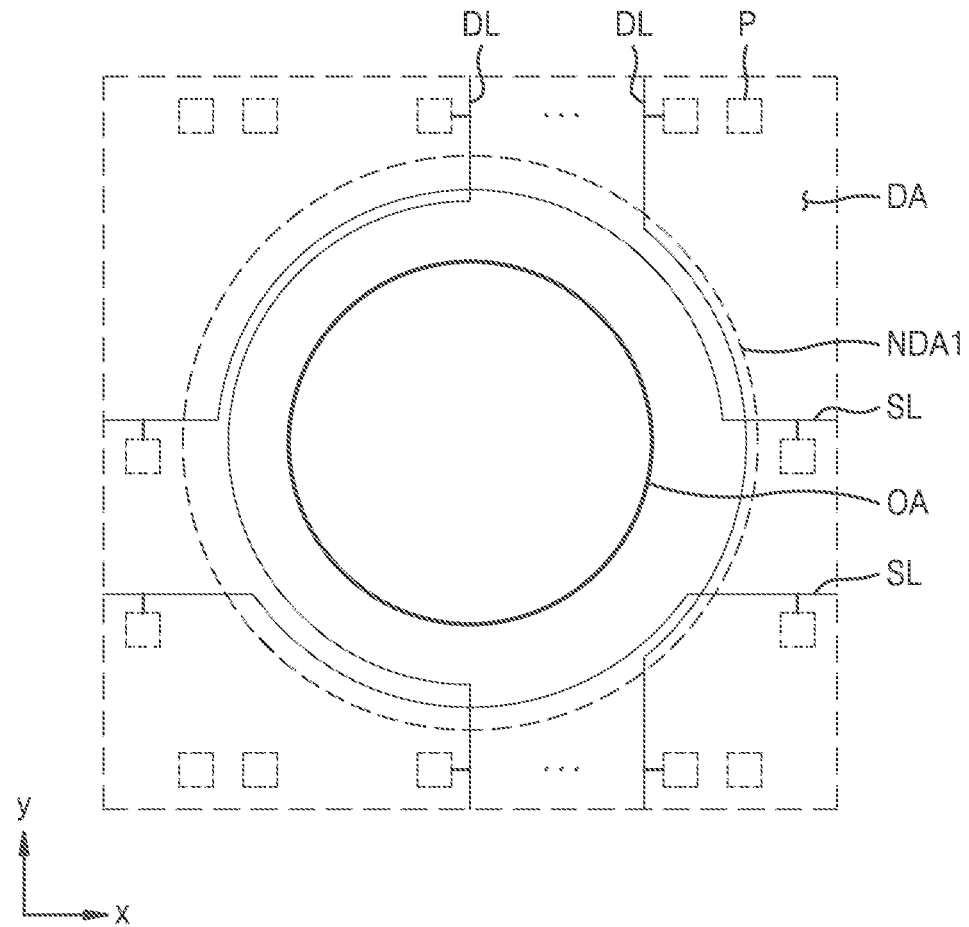
FIG. 5 is a plan view of a portion of a display panel according to an embodiment showing signal lines located in a first non-display area.

FIG. 5 is a plan view of a portion of a display panel according to an embodiment and shows lines located in the first non-display area NDA1.

Referring to FIG. 5, pixels P may be arranged in the display area DA around the opening area OA, and the first non-display area NDA1 may be located between the opening area OA and the display area DA.

The pixels P may be spaced apart from each other around the opening area OA. The pixels P may be vertically spaced apart from each other around the opening area OA, or horizontally spaced apart from each other around the opening area OA.

Signal lines adjacent to the opening area OA, from among signal lines that supply signals to the pixels P, may detour around the opening area OA. Some of the data lines DL that traverse the display area DA may extend in a y direction to provide data signals to the pixels P arranged vertically around the opening area OA, and may detour around the first non-display area NDA1 along an edge (e.g., an arc) of the opening area OA. Some of the scan lines SL that traverse the display area DA may extend in an x direction to provide scan signals to the pixels P arranged horizontally around the opening area OA, and may detour around the first non-display area NDA1 along an edge (e.g., an arc) of the opening area OA.

Figure 6:
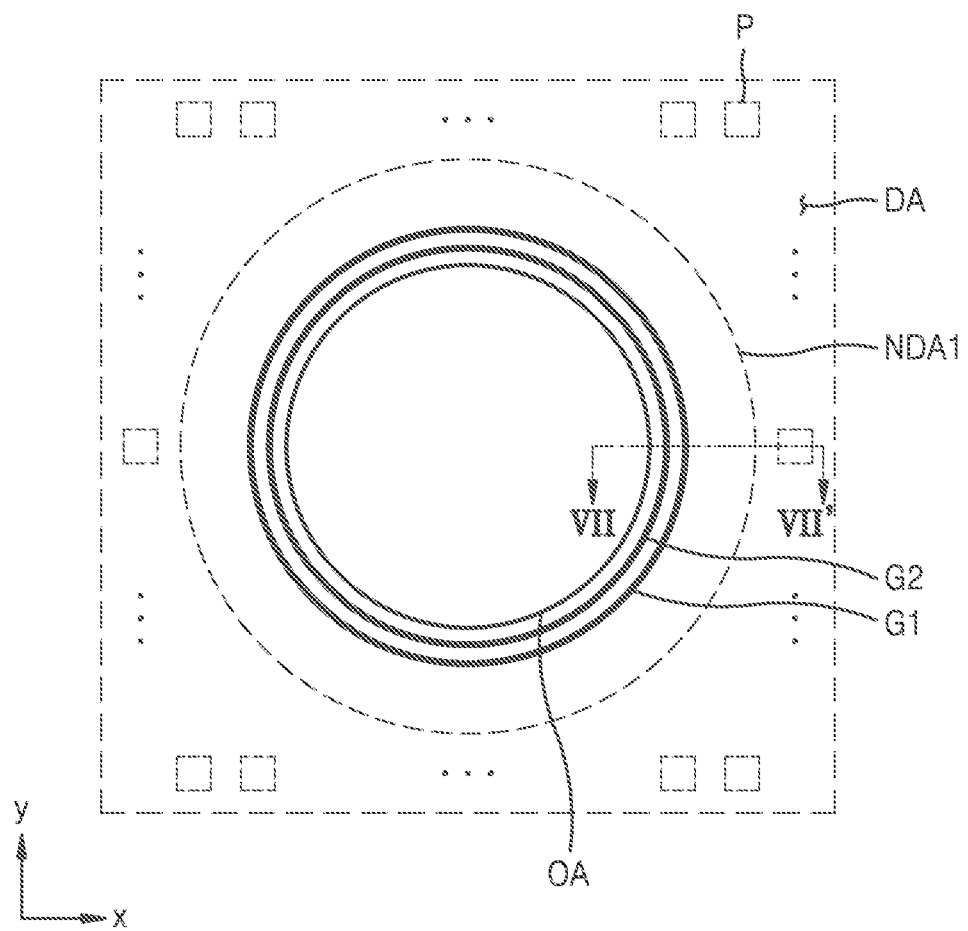
FIG. 6 is a plan view of a portion of a display panel according to an embodiment showing grooves located in a first non-display area.

FIG. 6 is a plan view of a portion of a display panel according to an embodiment and shows grooves located in the first non-display area NDA1.

Grooves are located between the opening area OA and the display area DA. The embodiment of FIG. 6 illustrates first and second grooves G1 and G2 located between the opening area OA and the display area DA. However, according to another embodiment, only one groove or three or more grooves may be arranged between the opening area OA and the display area DA.

Each of the first and second grooves G1 and G2 may have a ring shape entirely surrounding the opening area OA in the first non-display area NDA1. In FIG. 6, because the opening area OA has a circular shape, the first and second grooves G1 and G2 are circular rings (e.g., in one or more embodiments, the shape of the grooves G1 and G2 corresponds to the shape of the opening area OA). However, the opening area OA may be in the shape of an oval or a polygon, and accordingly, each of the first and second grooves G1 and G2 may also have any of various types of ring shapes. A diameter of each of the first and second grooves G1 and G2 with respect to a center point of the opening area OA may be greater than a diameter of the opening area OA, and the first and second grooves G1 and G2 may be spaced apart from each other by an interval (e.g., a gap) in the first non-display area NDA1.

Figure 7:
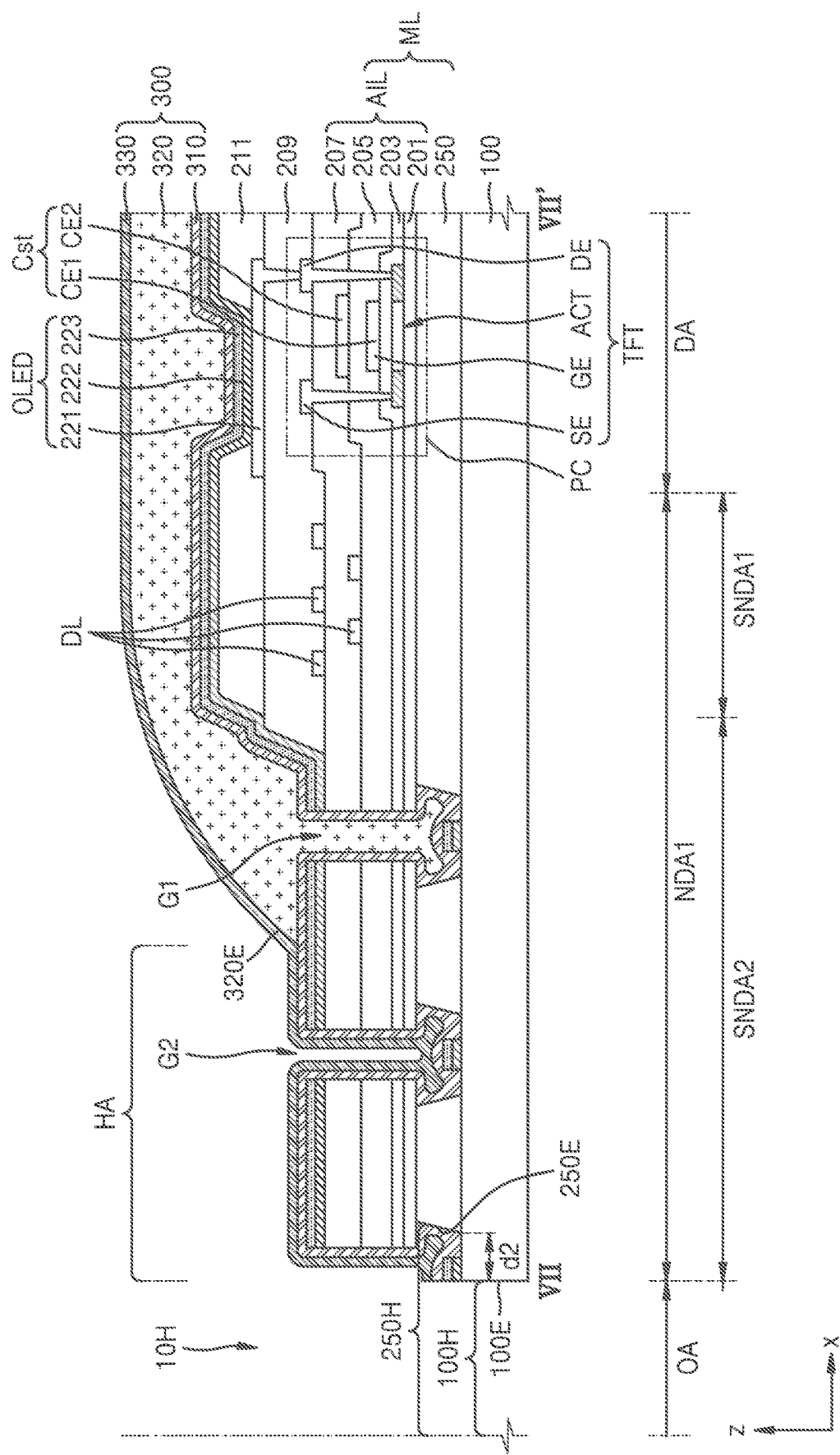
FIG. 7 is a cross-sectional view of the display panel of FIG. 6.
Figure 8:
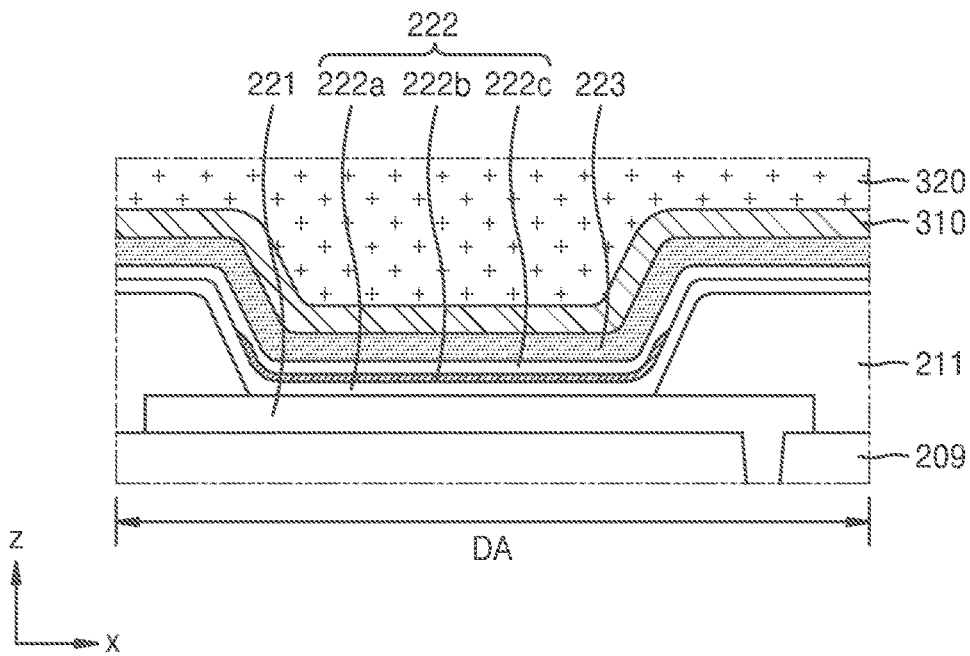
FIG. 8 is a magnified cross-sectional view of an organic light-emitting display diode according to an embodiment.
Figure 9A:
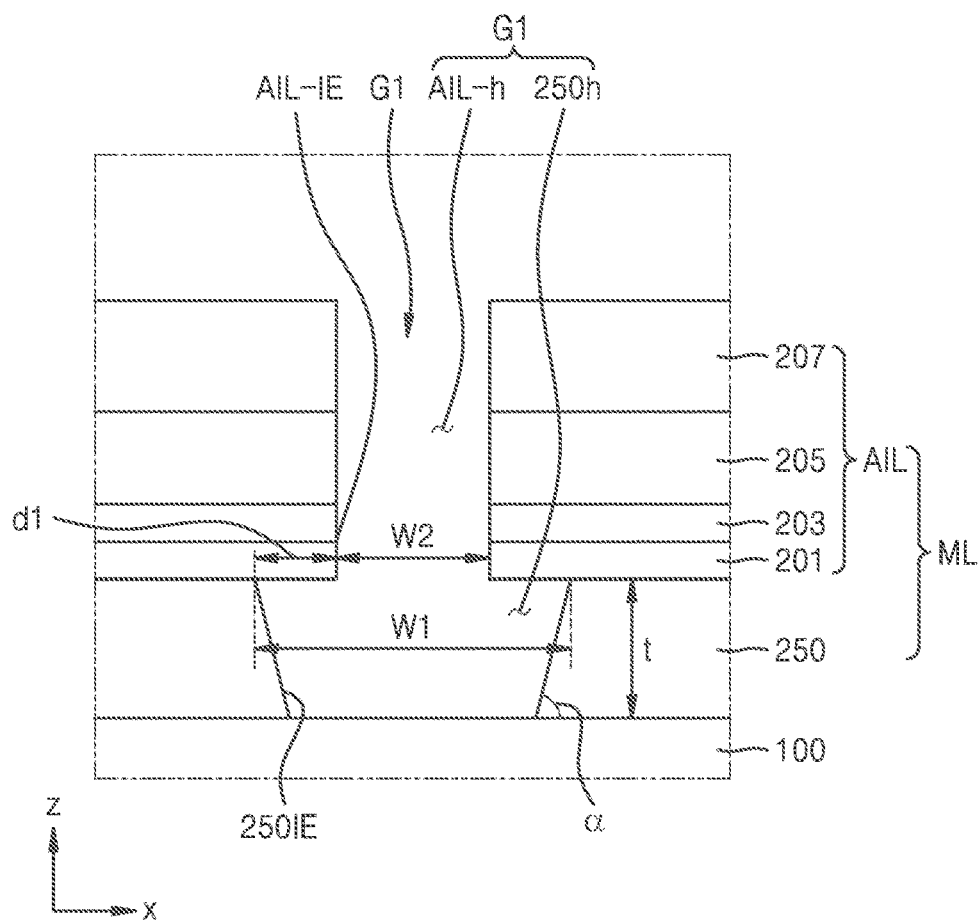
FIG. 9A is a cross-sectional view of a first groove according to an embodiment.
Figure 9B:
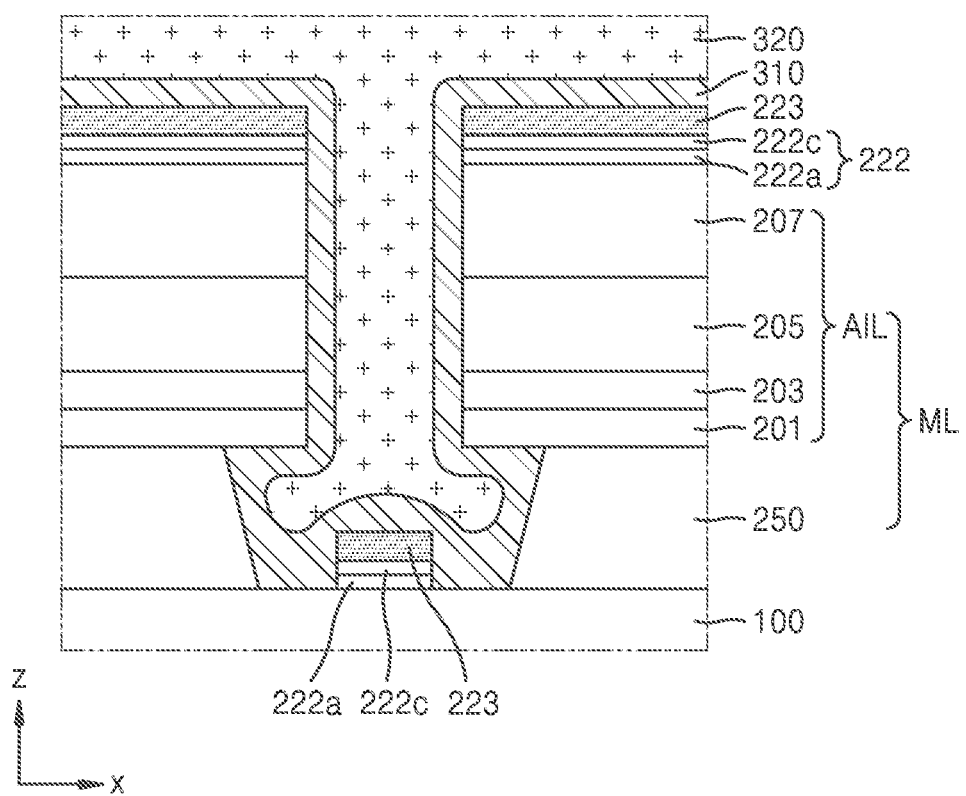
FIG. 9B is a cross-sectional view illustrating a stacked structure on the first groove of FIG. 9A.

FIG. 7 is a cross-sectional view of the display panel according to an embodiment, and corresponds to a cross-section taken along a line VII-VII' of FIG. 6. FIG. 8 is a enlarged cross-sectional view of an OLED of FIG. 7. FIG. 9A is a cross-sectional view of the first groove G1, and FIG. 9B is a cross-sectional view illustrating a stacked structure on the first groove G1 of FIG. 9A.

Referring to the display area DA of FIG. 7, the substrate 100 may be a substrate including a glass material, polymer material or/and metal material as described above.

A buffer layer 201 to prevent infiltration of impurities into a semiconductor layer of a TFT may be arranged on the substrate 100. The buffer layer 201 may include an inorganic insulating material, such as silicon nitride or silicon oxide, and may be a single layer or multiple layers including the inorganic insulating material.

A pixel circuit PC including a TFT and a storage capacitor Cst may be arranged on the buffer layer 201. The TFT may include a semiconductor layer ACT, a gate electrode GE, a source electrode SE, and a drain electrode DE. The TFT of FIG. 7 may correspond to the driving TFT of FIG. 4. According to the present embodiment, the TFT is a top gate type in which the gate electrode GE is arranged on the semiconductor layer ACT with a gate insulating layer 203 therebetween. However, according to another embodiment, the TFT may be a bottom gate type in which a gate electrode is arranged below a gate insulating layer and a semiconductor layer is arranged above the gate insulating layer.

The semiconductor layer ACT may include polysilicon. Alternatively, the semiconductor layer ACT may include amorphous silicon, an oxide semiconductor, or an organic semiconductor. The gate electrode GE2 may include a low resistance metal material. The gate electrode GE may include a conductive material including molybdenum (Mo), aluminum (Al), copper (Cu), and titanium (Ti), and may be formed as a multi-layer or single layer including the aforementioned materials.

The gate insulating layer 203 may be interposed between the semiconductor layer ACT and the gate electrode GE and may include an inorganic insulating material, such as silicon oxide, silicon nitride, silicon oxynitride, aluminum oxide, titanium oxide, tantalum oxide, or hafnium oxide.

The source electrode SE and the drain electrode DE may include a highly conductive material. Each of the source electrode SE and the drain electrode DE may include a conductive material including Mo, Al, Cu, and Ti, and may be a multi-layer or single layer including the aforementioned materials. According to an embodiment, each of the source electrode SE and the drain electrode DE may be formed as a multi-layer (triple-layer) of Ti/Al/Ti.

The storage capacitor Cst includes a lower electrode CE1 and an upper electrode CE2 with a first interlayer insulating layer 205 therebetween. The lower electrode CE1 and the upper electrode CE2 overlap each other. The storage capacitor Cst may be covered with a second interlayer insulating layer 207.

The storage capacitor Cst may be overlapped with the TFT. FIG. 7 illustrates a case where the gate electrode GE of the TFT is the lower electrode CE1 of the storage capacitor Cst, but the present disclosure is not limited thereto. According to another embodiment, the storage capacitor Cst may not overlap with the TFT.

The first and second interlayer insulating layers 205 and 207 may include an inorganic insulating material, such as silicon oxide, silicon nitride, silicon oxynitride, aluminum oxide, titanium oxide, tantalum oxide, or hafnium oxide, and may each be multi-layers or single layers.

The pixel circuit PC including the TFT and the storage capacitor Cst may be covered with a planarization insulating layer 209. The planarization insulating layer 209 may be an organic insulating layer including a commercial polymer such as polymethyl methacrylate (PMMA) or polystyrene (PS), a polymer derivative having a phenol-based group, an acryl-based polymer, an imide-based polymer, an acryl ether-based polymer, an amide-based polymer, a fluorine-based polymer, a p-xylene-based polymer, a vinyl alcohol-based polymer, a blend thereof, or the like. According to an embodiment, the planarization insulating layer 209 may include polyimide.

The OLED may be arranged on the planarization insulating layer 209. A pixel electrode 221 of the OLED may be arranged on the planarization insulating layer 209 and may be connected to the pixel circuit PC via a contact hole of the planarization insulating layer 209.

The pixel electrode 221 may include conductive oxide, such as indium tin oxide (ITO), indium zinc oxide (IZO), zinc oxide (ZnO), indium oxide ($In_2O_3$), indium gallium oxide (IGO), or aluminum zinc oxide (AZO). According to another embodiment, the pixel electrode 221 may include a reflection layer including silver (Ag), magnesium (Mg), aluminum (Al), platinum (Pt), palladium (Pd), gold (Au), nickel (Ni), neodymium (Nd), iridium (Ir), chromium (Cr), or a compound of these materials. According to another embodiment, the pixel electrode 221 may further include a film formed of ITO, IZO, ZnO, or $In_2O_3$ above/below the reflection layer.

A pixel-defining layer 211 includes an opening via which an upper surface of the pixel electrode 221 is exposed, and covers an edge of the pixel electrode 221. The pixel-defining layer 211 may include an organic insulating material. The pixel-defining layer 211 may include the organic insulating material described above in the above-description of the planarization insulating layer 209. The pixel-defining layer 211 may include the organic insulating material and/or an inorganic insulating material. According to an embodiment, the pixel-defining 211 may include polyimide.

An intermediate layer 222 of the OLED includes an emission layer. The emission layer may include a low molecular or high molecular organic material that emits light of a certain color. According to an embodiment, as shown in FIG. 8, the intermediate layer 222 may further include a first functional layer 222a arranged below an emission layer 222b, and/or a second functional layer 222c arranged above the emission layer 222b.

The first functional layer 222a may be a single layer or a multi-layer. For example, when the first functional layer 222a is formed of a high molecular weight material, the first functional layer 222a is a hole transport layer (HTL) having a single-layer structure, and may be formed of poly-(3,4)-ethylene-dihydroxy thiophene (PEDOT) or polyaniline (PANI). On the other hand, when the first functional layer 222a is formed of a low molecular weight material, the first functional layer 222a may include a hole injection (HIL) and an HTL.

The second functional layer 222c is optional. For example, when the first functional layer 222a and the emission layer 222b are formed of high molecular weight materials, the second functional layer 222c may be formed to improve the characteristics of the OLED. The second functional layer 222c may be a single layer or a multi-layer. The second functional layer 222c may include an electron transport layer (ETL), and/or an electron injection layer (EIL).

Some of a plurality of layers that constitute the intermediate layer 222, for example, the first and second functional layers 222a and 222c, may be arranged not only in the display area DA but also in the first non-display area NDA1, and may be disconnected in the first non-display area NDA1 by the first groove G1 and the second groove G2 described below.

An opposite electrode 223 of the OLED may be arranged to face the pixel electrode 221, with the intermediate layer 222 therebetween. The opposite electrode 223 may be formed of a conductive material having a low work function. For example, the opposite electrode 223 may include a (semi)transparent layer including silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca) or an alloy of these materials. Alternatively, the opposite electrode 223 may further include a layer, such as ITO, IZO, ZnO, or $In_2O_3$, on the (semi)transparent layer including any of the above-described materials.

The OLED is covered with the thin-film encapsulation layer 300. The thin-film encapsulation layer 300 may include at least one organic encapsulation layer and at least one inorganic encapsulation layer. Although the thin-film encapsulation layer 300 includes first and second inorganic encapsulation layers 310 and 330 and an organic encapsulation layer 320 therebetween in FIG. 7, a stacking order of the first and second inorganic encapsulation layers 310 and 330 and the organic encapsulation layer 320 and the numbers of inorganic encapsulation layers and organic encapsulation layers may be changed.

The first and second inorganic encapsulation layers 310 and 330 may include an inorganic insulating material of at least one of aluminum oxide, titanium oxide, tantalum oxide, hafnium oxide, zinc oxide, silicon oxide, silicon nitride, and silicon oxynitride, and may be formed via chemical vapor deposition (CVD) or the like. The organic encapsulation layer 320 may include a polymer-based material. Examples of the polymer-based material may include acrylic resin, epoxy resin, polyimide, and polyethylene.

Referring to the first non-display area NDA1 of FIG. 7, the first non-display area NDA1 may include a first sub-non-display area SNDA1, which is distal to the opening area OA, and a second sub-non-display area SNDA2, is proximate to the opening area OA (e.g., the second sub-non-display area SNDA2 is closer to the opening area OA than the first sub-non-display area SNDA1).

The first sub-non-display area SNDA1 is an area traversed by wires, e.g., the signal lines described above with reference to FIG. 5. FIG. 7 illustrates data lines DL located in the first sub-non-display area SNDA1. The data lines DL of FIG. 7 correspond to the data lines DL that detour around the opening area OA described with reference to FIG. 5. The data lines DL may be alternately arranged with an insulating layer (e.g., a second interlayer insulating layer) therebetween. In this case, a gap (a pitch) between adjacent data lines DL may be reduced and a width of the first non-display area NDA1 may be reduced. According to another embodiment, the data lines DL may be all arranged on the same layer, for example, on the second interlayer insulating layer 207.

Although FIG. 7 shows the data lines DL located in the first sub-non-display area SNDA1, the scan lines that detour the opening area OA described with reference to FIG. 5 may be also located in the first sub-non-display area SNDA1.

The second sub-non-display area SNDA2 may be an area in which the first and second grooves G1 and G2 are arranged. The first and second grooves G1 and G2 are formed in a multi-layer ML arranged on the substrate 100. The multi-layer ML includes a lower insulating layer 250 and at least one insulating layer AIL arranged on the lower insulating layer 250. The lower insulating layer 250 may be interposed between the substrate 100 and the pixel circuit PC, for example, between the substrate 100 and the TFT. The embodiment of FIG. 7 illustrates the lower insulating layer 250 arranged directly on the substrate 100. The at least one insulating layer AIL may include an inorganic insulating layer. In the embodiment illustrated in FIG. 7, the at least one insulating layer AIL includes the buffer layer 201, the gate insulating layer 203, the first interlayer insulating layer 205, and the second interlayer insulating layer 207. The at least one insulating layer AIL may refer to one or more insulating layers selected from the buffer layer 201, the gate insulating layer 203, the first interlayer insulating layer 205, and the second interlayer insulating layer 207.

The first and second grooves G1 and G2 may have certain depths in a thickness direction of the multi-layer ML, and each of the first and second grooves G1 and G2 may have an undercut structure in which a width of a portion of each of the first and second grooves G1 and G2 that pass through the lower insulating layer 250 is greater than a width of a portion of each of the first and second grooves G1 and G2 that passes through the at least one insulating layer AIL. Like the at least one insulating layer AIL being an inorganic insulating layer and the lower insulating layer 250 being an organic insulating layer, the at least one insulating layer AIL and the lower insulating layer 250 may include different materials from each other. The lower insulating layer 250 may include, for example, polyimide.

Referring to FIG. 9A, a first width W1 of a portion of the first groove G1 that penetrates through the lower insulating layer 250 in the depth direction is greater than a second width W2 of a portion of the first groove G1 that penetrates through the at least one insulating layer AIL. A lateral surface of the at least one insulating layer AIL may protrude further toward a center of the first groove G1 than a lateral surface 250IE of the lower insulating layer 250, and a protruding portion of the at least one insulating layer AIL may form a tip (or an eave) (e.g., a lower surface of the at least one insulating layer AIL may overhang the portion of the first groove G1 in the lower insulating layer 250). FIG. 9A illustrates a pair of tips (or eaves). The tip may protrude by about 0.9 μm to about 1.2 μm in the x direction farther than the lateral surface 250IE of the lower insulating layer 250.

The first groove G1 may be formed by etching the at least one insulating layer AIL and the lower insulating layer 250. An etchant or an etch gas that is used during an etching process for removing a portion of the at least one insulating layer AIL may include a different material from an etchant or an etch gas that is used during an etching process for removing a portion of the lower insulating layer 250.

Via etching, a first hole 250h may be formed in the lower insulating layer 250 and a second hole AIL-h may be formed in the at least one insulating layer AIL. The first hole 250h and the second hole AIL-h may be connected to each other (e.g., in communication with each other) to form the first groove G1. The first width W1 of the first hole 250h is greater than the second width W2 of the second hole AIL-h, and the first groove G1 may have an undercut structure in which a lower width is greater than an upper width. FIG. 9A illustrates that a lateral surface AIL-IE of the at least one insulating layer AIL that defines the second hole AIL-h protrudes by a first distance d1 toward the center of the first groove G1 in a lateral direction (x direction), farther than the lateral surface 250IE of the lower insulating layer 250 that defines the first hole 250h. In the illustrated embodiment, the first hole 250h of first groove G1 that penetrates through the lower insulating layer 250 may taper from a relatively wider end at an upper surface of the lower insulating layer 250 facing the at least one insulating layer AIL to a relatively narrower end at a lower surface of the lower insulating layer 250 facing the substrate 100 (e.g., the lateral surface 250IE may taper from a relatively wider upper end to a relatively narrower lower end). Additionally, the width W1 may refer to the width of the relative wider upper end of the first hole 250h at the upper surface of the lower insulating layer 250.

The first distance d1 may be less than a thickness t of the lower insulating layer 250, may be equal to the thickness t of the lower insulating layer 250, or may be greater than the thickness t of the lower insulating layer 250. The first distance d1 may be greater than a thickness of the first inorganic encapsulation layer 310 or may be greater than a sum of respective thicknesses of the first and second inorganic encapsulation layers 310 and 330. According to an embodiment, the first distance d1 may be equal to or greater than about 1 μm. In other words, the tip may protrude by the first distance d1 farther than the lateral surface 250IE of the lower insulating layer 250 toward the center of the first groove G1.

After the first groove G1 is formed in the multi-layer ML as shown in FIG. 9A, the intermediate layer 222 and the opposite electrode 223 may be formed via thermal deposition or the like. Some of the plurality of layers that constitute the intermediate layer 222, for example, the first or/and second functional layers 222a or/and 222c, and the opposite electrode 223 may be formed on the substrate 100 via deposition. At this time, the first and/or second functional layers 222a and/or 222c and the opposite electrode 223 may each be disconnected by the first groove G1 and the second groove G2 located in the first non-display area NDA1. FIG. 9B illustrates that the first and/or second functional layers 222a and/or 222c of the intermediate layer 222 and the opposite electrode 223 are each disconnected by the first groove G1.

Although FIGS. 9A and 9B have been described above by focusing on the first groove G1, the second groove G2 has the same structure as the first groove G1, and the first and/or second functional layer 222a or/and 222c and the opposite electrode 223 are each disconnected by the second groove G2, as described above.

Referring back to FIG. 7, the thin-film encapsulation layer 300 also covers the first non-display area NDA1. Because the first inorganic encapsulation layer 310 that is formed via CVD or the like has a relatively high step coverage in contrast with the intermediate layer 222 and the opposite electrode 223, the first inorganic encapsulation layer 310 may cover the entire respective inner surfaces of the first and second grooves G1 and G2. As shown in FIG. 9B, the first inorganic encapsulation layer 310 may cover the lateral surface 250IE and a bottom surface of the lower insulating layer 250 and the lateral surface AIL-IE and a bottom surface of the at least one insulating layer AIL. These surfaces define the first groove G1. The bottom surface of the lower insulating layer 250 may correspond to an upper surface of the substrate 100, and the bottom surface of the at least one insulating layer AIL may correspond to a lower surface of the buffer layer 201.

The first inorganic encapsulation layer 310 may cover the disconnected first and second functional layers 222a and 222c and the disconnected opposite electrode 233 located within the first and second grooves G1 and G2 and may directly contact a portion of the upper surface of the substrate 100 exposed via the first groove G1. A thickness of the first inorganic encapsulation layer 310, for example, a thickness thereof in a direction (z direction) perpendicular to the substrate 100, may be less than the thickness t of the lower insulating layer 250. A portion of the first groove G1 may be at least partially filled with the organic encapsulation layer 320 on the first inorganic encapsulation layer 310.

As illustrated in FIG. 7, the organic encapsulation layer 320 may cover not only the display area DA but also a portion of the first non-display area NDA1. For example, an end 320E of the organic encapsulation layer 320 may be between the first groove G1 and the second groove G2. The organic encapsulation layer 320 may be formed by coating monomer or the like on the substrate 100 and then hardening the coated monomer. When the organic encapsulation layer 320 is exposed via the opening 10H, moisture may infiltrate via the organic encapsulation layer 320. To address this problem, a portion of the organic encapsulation layer 320, for example, a portion thereof corresponding to an area HA between the opening area OA and the first groove G1, may be removed via ashing process or the like. Accordingly, as viewed in a direction perpendicular to the upper surface of the substrate 100, the area HA not including the organic encapsulation layer 320 may be in the shape of a ring that surrounds the opening area OA, and the end 320E of the organic encapsulation layer 320 may be located between the first groove G1 and the second groove G2.

As the end 320E of the organic encapsulation layer 320 is located closer to the display area DA than respective ends of the first and second inorganic encapsulation layers 310 and 330, the first and second inorganic encapsulation layers 310 and 330 may directly contact each other in the area HA. The first and second inorganic encapsulation layers 310 and 330 may directly contact each other in the second groove G2 and around the opening 10H of the display panel 10.

An end 100E of the substrate 100 directed toward the opening 10H of the display panel 10 may protrude further toward the opening 10H than an end 250E of the lower insulating layer 250 directed toward the opening 10H. Although FIG. 7 illustrates a cross-section, as viewed in a direction perpendicular to the upper surface of the substrate 100 in both FIGS. 6 and 7, like the substrate 100 including the first opening 100H corresponding to the opening area OA, the lower insulating layer 250 may include an opening 250H corresponding to the opening area OA, and the opening 250H of the lower insulating layer 250 may have a greater diameter than the first opening 100H of the substrate 100.

The first opening 100H of the substrate 100 may be formed via laser cutting, drilling, etc. When an impact is applied to the at least one insulating layer AIL, which is an inorganic insulating layer, during a process of forming the first opening 100H, cracks may be generated, and foreign materials, such as external moisture, may infiltrate via the cracks of the at least one insulating layer AIL. However, when a portion of the multi-layer ML corresponding to the opening area OA is removed during an etching process of forming the first and second grooves G1 and G2 and then the aforementioned laser cutting or drilling is performed to form the first opening 100H in the substrate 100, the formation of cracks in the inorganic insulating layer may be prevented. A second distance d2 may be understood as a margin sufficient to prevent the inorganic insulating layer from cracking during laser cutting or drilling. The second distance d2 is a distance between the end 100E of the substrate 100 and the end 250E of the lower insulating layer 250 and may be about 0.1 μm or greater.

Figure 10A:
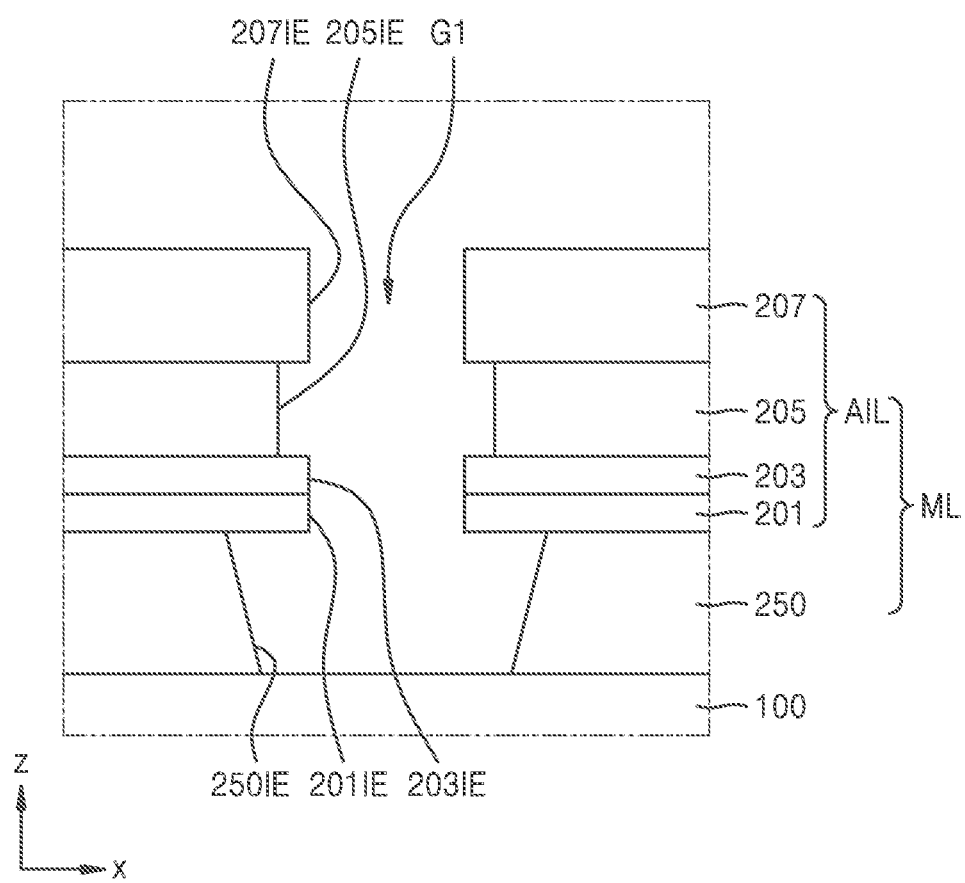
FIG. 10A is a cross-sectional view of a first groove according to another embodiment.
Figure 10B:
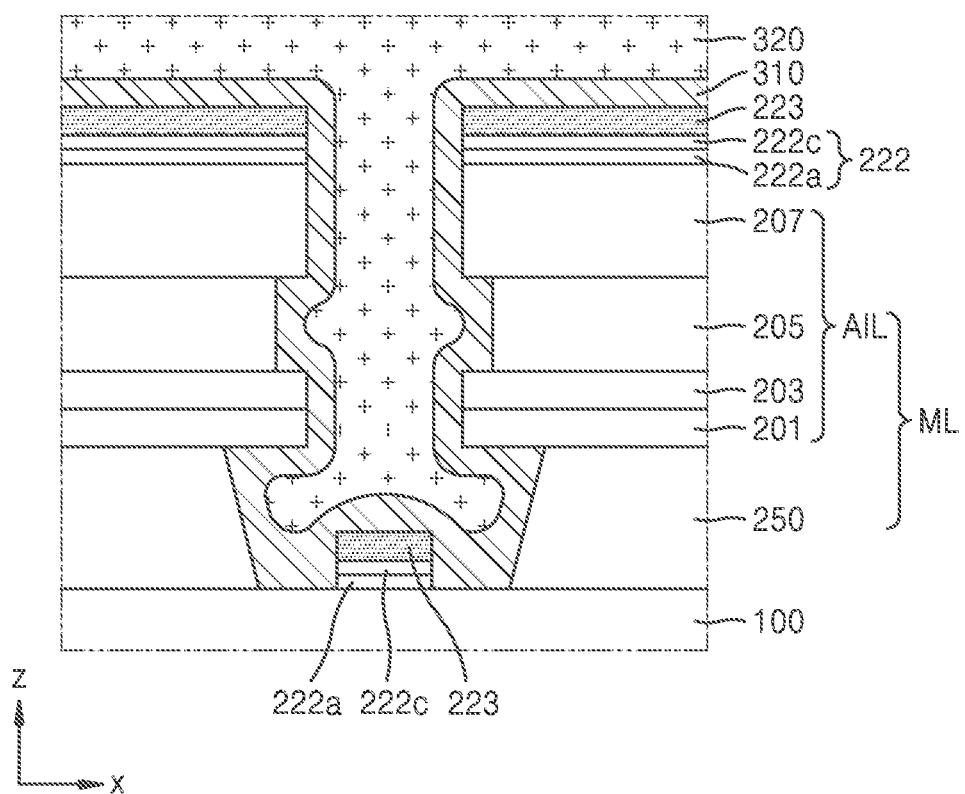
FIG. 10B is a cross-sectional view illustrating a stacked structure on the first groove of FIG. 10A.

FIG. 10A is a cross-sectional view of a first groove G1 according to another embodiment, and FIG. 10B is a cross-sectional view illustrating a stacked structure on the first groove G1 of FIG. 10A. Referring to the above-described first groove G1 of FIGS. 9A and 9B, the lateral surface AIL-IE of the at least one insulating layer AIL is relatively flat. On the other hand, referring to FIGS. 10A and 10B, an undercut structure is locally formed in the at least one insulating layer AIL, and a lateral surface of the at least one insulating layer AIL facing the first groove G1 is uneven.

The at least one insulating layer AIL may include an inorganic insulating layer, for example, a plurality of inorganic insulating layers including silicon element. Amounts by which the buffer layer 201, the gate insulating layer 203, the first interlayer insulating layer 205, and the second interlayer insulating layer 207 are etched during an etching process may be different from each other according to various conditions (e.g., the time, the composition of an etchant or etch gas, and the like) during the etching process and/or the respective materials or the like included in the buffer layer 201, the gate insulating layer 203, the first interlayer insulating layer 205, and the second interlayer insulating layer 207. For example, when the buffer layer 201 and the first interlayer insulating layer 205 include silicon oxide and the gate insulating layer 203 and the second interlayer insulating layer 207 include silicon nitride, the amounts by which the buffer layer 201, the gate insulating layer 203, the first interlayer insulating layer 205, and the second interlayer insulating layer 207 are etched may be different from each other depending on the etching conditions (e.g., time and the like) even when the same etching gas is used, as shown in FIG. 10A. A lateral surface 201 IE of the buffer layer 201, a lateral surface 203IE of the gate insulating layer 203, and a lateral surface 207IE of the second interlayer insulating layer 207 may protrude further toward the center of the first groove G1 than a lateral surface 205IE of the first interlayer insulating layer 205 adjacent thereto and a lateral surface 250IE of the lower insulating layer 250 adjacent thereto. Accordingly, a plurality of undercut structures may be formed in the at least one insulating layer AIL such that the at least one insulating layer AIL has an uneven lateral surface facing the first groove G1. The aforementioned uneven lateral surface of the first groove G1 is not just a concave and convex surface but is obtained as a plurality of inorganic insulating layers included in the at least one insulating layer AIL has different materials from each other. Thus, the aforementioned uneven lateral surface may be understood as an uneven surface according to a change in a material in a thickness direction of the inorganic insulating layers.

After the first groove G1 of FIG. 10A is formed, the intermediate layer 222, for example, the first and second functional layers 222a and 222c, and the opposite electrode 223 are formed via deposition and are each disconnected by the first groove G1, as described above with reference to FIG. 9B. As described above with reference to FIG. 9B, the first inorganic encapsulation layer 310 and the organic encapsulation layer 320 are sequentially stacked on the opposite electrode 223.

Figure 11:
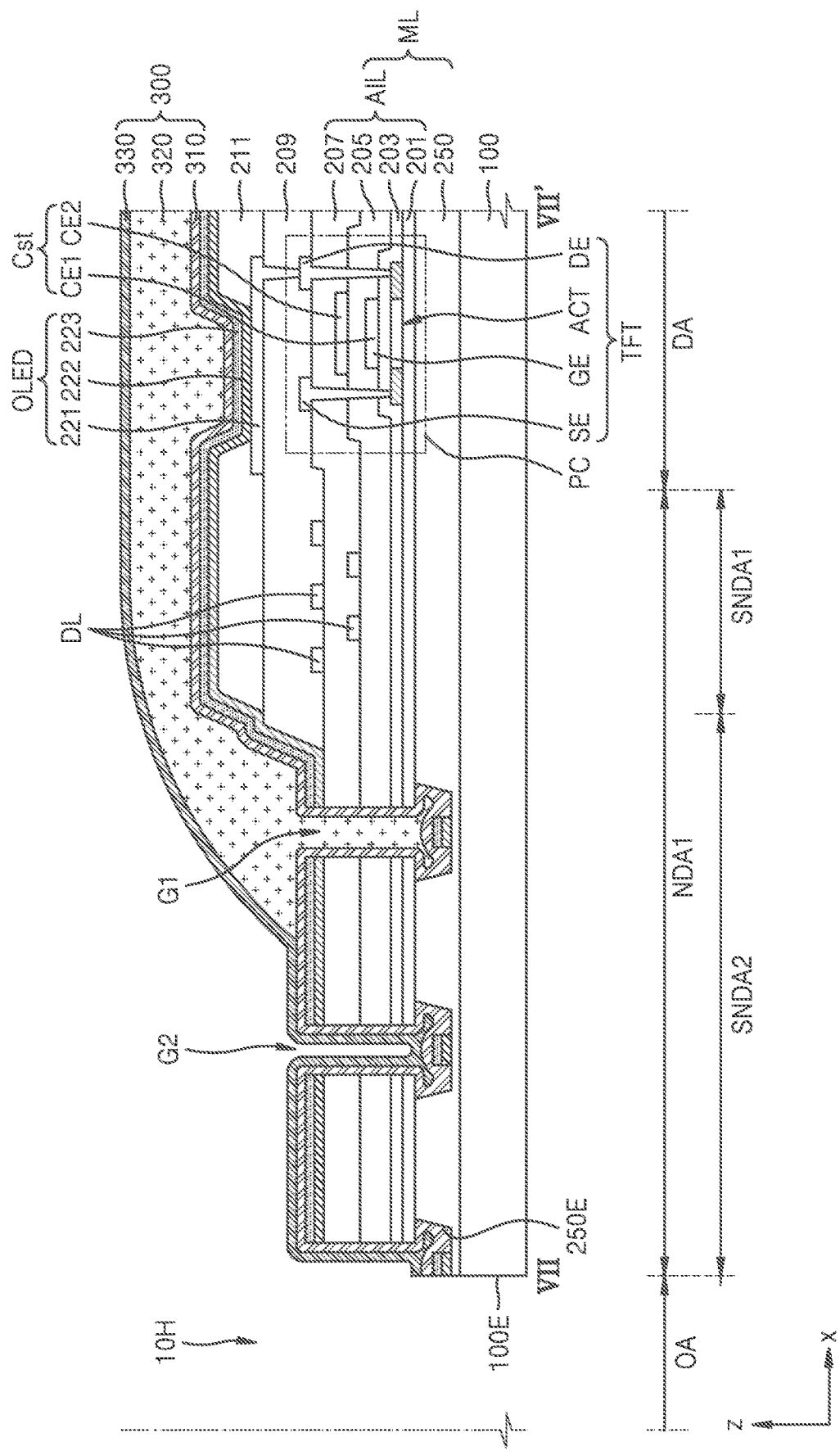
FIG. 11 is a cross-sectional view of a display panel according to another embodiment.
Figure 12A:
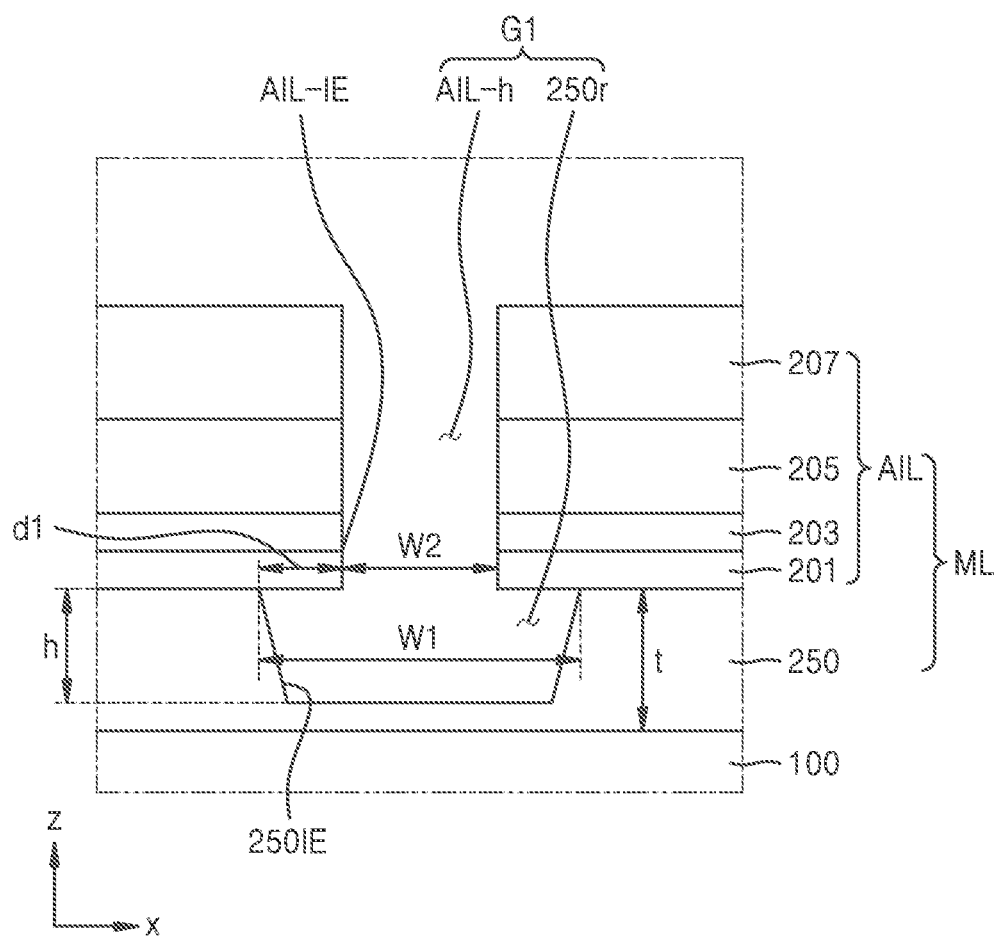
FIG. 12A is a cross-sectional view of a first groove according to another embodiment.
Figure 12B:
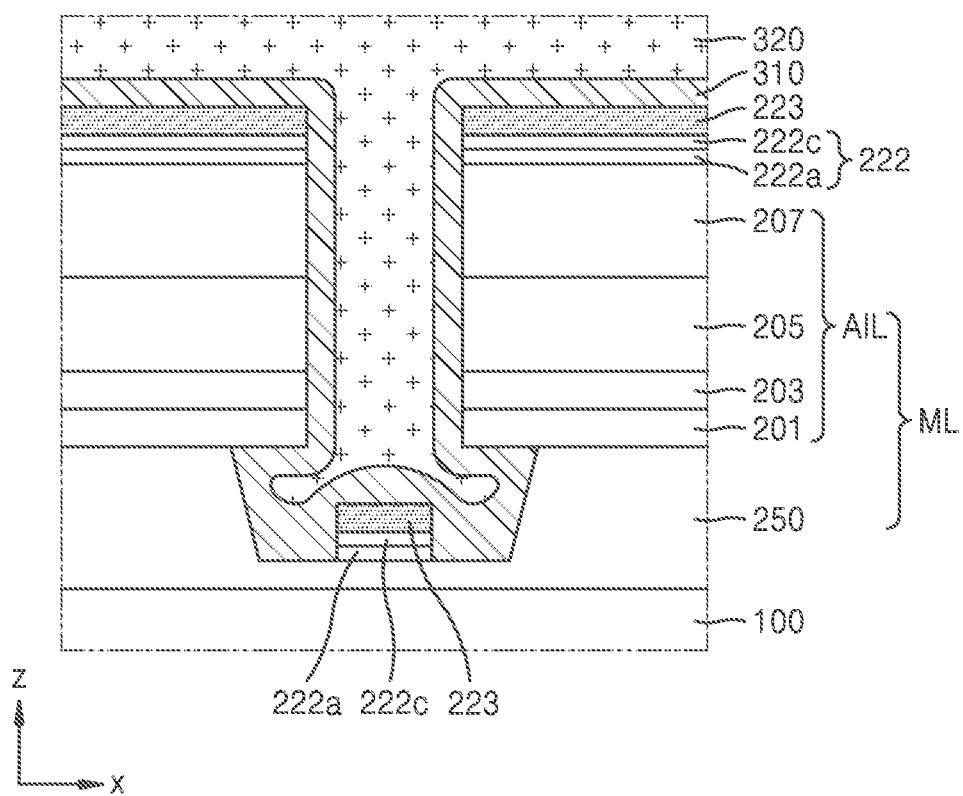
FIG. 12B is a cross-sectional view illustrating a stacked structure on the first groove of FIG. 12A.

FIG. 11 is a cross-sectional view of a display panel according to another embodiment, and corresponds to the cross-section taken along the line VII-VII' of FIG. 6. FIG. 12A is a cross-sectional view of a first groove G1 included in the display panel of FIG. 11, and FIG. 12B is a cross-sectional view illustrating a stacked structure on the first groove G1 of FIG. 12A. The display panel of FIGS. 11 through 12B is substantially the same as the display panel of FIGS. 7 through 9B, and thus mainly a difference therebetween will now be described.

Referring to FIG. 11, first and second grooves G1 and G2 may be formed in the multi-layer ML, and bottom surfaces of the first and second grooves G1 and G2 may be on a virtual surface that is different from the upper surface of the substrate 100. For example, unlike the bottom surfaces of the first and second grooves G1 and G2 of FIGS. 7 and 9A being arranged on the same virtual surface as the upper surface of the substrate 100, the bottom surfaces of the first and second grooves G1 and G2 of FIGS. 11 and 12A may be on a virtual surface that is over (e.g., above) the upper surface of the substrate 100 and is also under an upper surface of the lower insulating layer 250.

Referring to FIG. 12A, the first groove G1 may be formed by etching the multi-layer ML. The second hole AIL-h penetrating through the at least one insulating layer AIL may be formed by etching a portion of the at least one insulating layer AIL, a first recess 250r not penetrating entirely through the lower insulating layer 250 may be formed by etching a portion of the lower insulating layer 250 (e.g., the first recess 250r may extend through only a portion of the lower insulating layer 250), and the first recess 250r and the second hole AIL-h may together form the first groove G1.

A depth h of the first recess 250r may be less than the thickness t of the lower insulating layer 250. The depth h of the first recess 250r may be equal to or greater than 50%, 60%, 70%, 80%, 90%, 95%, or 97% of the thickness t of the lower insulating layer 250, but less than the thickness t of the lower insulating layer 250. The first recess 250r and the second hole AIL-h may be connected to each other to form the first groove G1, and the bottom surface of the first groove G1 may be on a virtual surface in between the upper surface of the substrate 100 and the upper surface of the lower insulating layer 250.

Because the lower insulating layer 250 is an organic insulating layer, when the lower insulating layer 250 remains below the first groove G1, there may exist a slight possibility that external moisture enters via the remaining lower insulating layer 250 and flows into the OLED of FIG. 11 via cracks of the inorganic insulating layer. However, when the substrate 100 is a rigid substrate as in an embodiment, there is a very low possibility or no possibility that cracks are generated in the inorganic insulating layer stacked on the substrate 100, and thus the above-described problem may be minimized.

When the intermediate layer 222, for example, the first and/or second functional layer 222a or/and 222c, and the opposite electrode 223 are formed on the first groove G1 of FIG. 12A, the first and/or second functional layer 222a or/and 222c and the opposite electrode 223 are each disconnected by the first groove G1, as shown in FIG. 12B.

The structure of FIGS. 11 through 12B in which the first recess 250r instead of a first hole is formed in the lower insulating layer 250 is equally applicable to the structure of the first groove G1 described above with reference to FIGS. 10A and 10B and structures derived therefrom.

Figure 13:
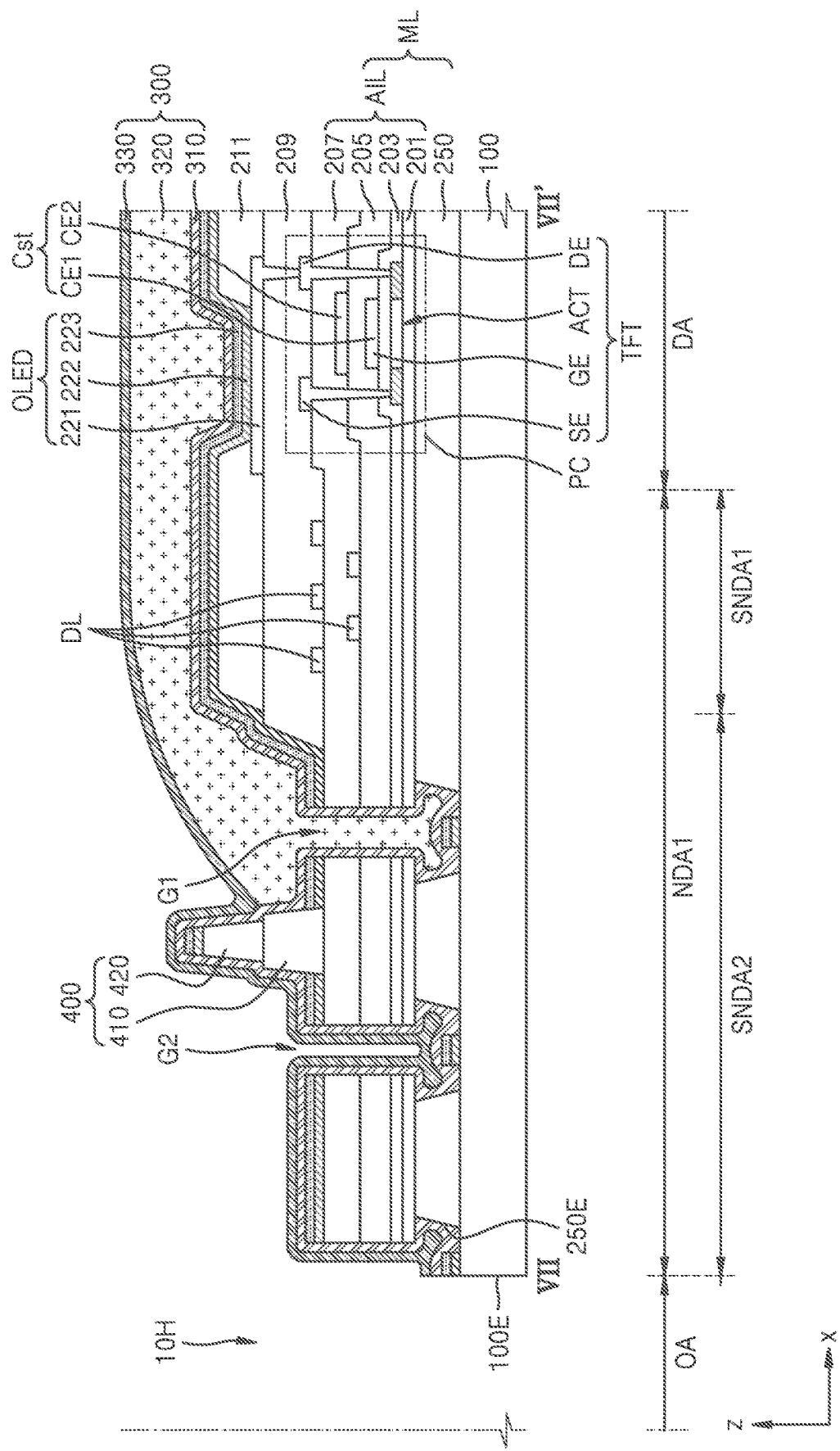
FIG. 13 is a cross-sectional view of a display panel according to another embodiment.

FIG. 13 is a cross-sectional view of a display panel according to another embodiment.

The display panel of FIG. 13 has substantially the same structure as the display panel of FIG. 7 except that a partition wall 400 is further included between the first groove G1 and the second groove G2.

The partition wall 400 may include an organic insulating material, and may have a ring shape that surrounds the opening area OA, for example, the opening 10H, when viewed in a direction perpendicular to the upper surface of the substrate 100. The partition wall 400 may include a first sub-partition wall layer 410 including the same material as that included in the planarization insulating layer 209, and a second sub-partition wall layer 420 including the same material as that included in the pixel defining layer 211. The partition wall 400 may control the flow of the monomer during a process of forming the organic encapsulation layer 320.

The partition wall 400 of FIG. 13 may be included in the display panel having the first and second grooves G1 and G2 described above with reference to FIGS. 10A and 10B, the display panel having the first and second grooves G1 and G2 described above with reference to FIGS. 11 through 12B, or various display panels derived from these display panels.

Figure 14:
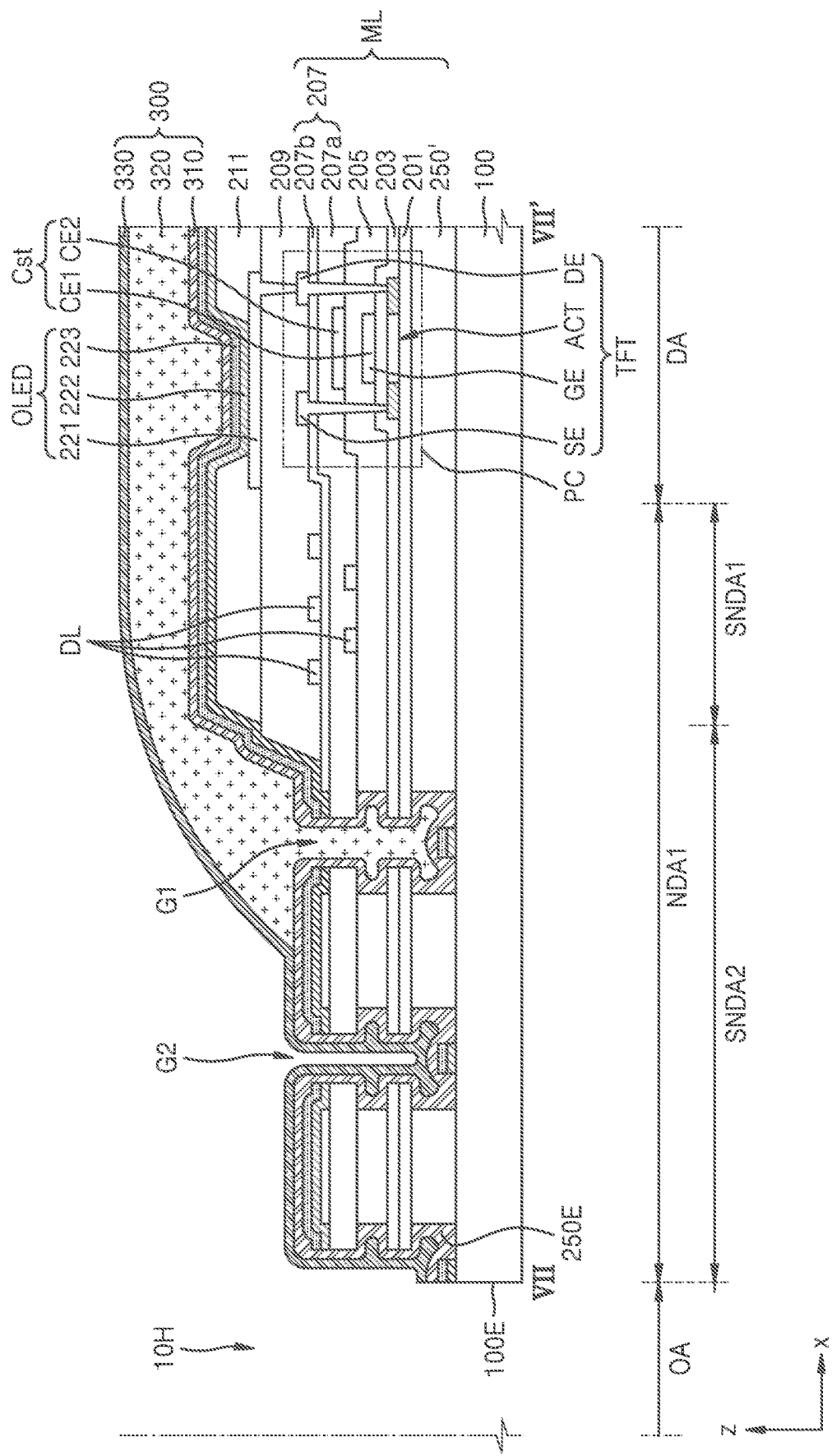
FIG. 14 is a cross-sectional view of a display panel according to another embodiment.
Figure 15A:
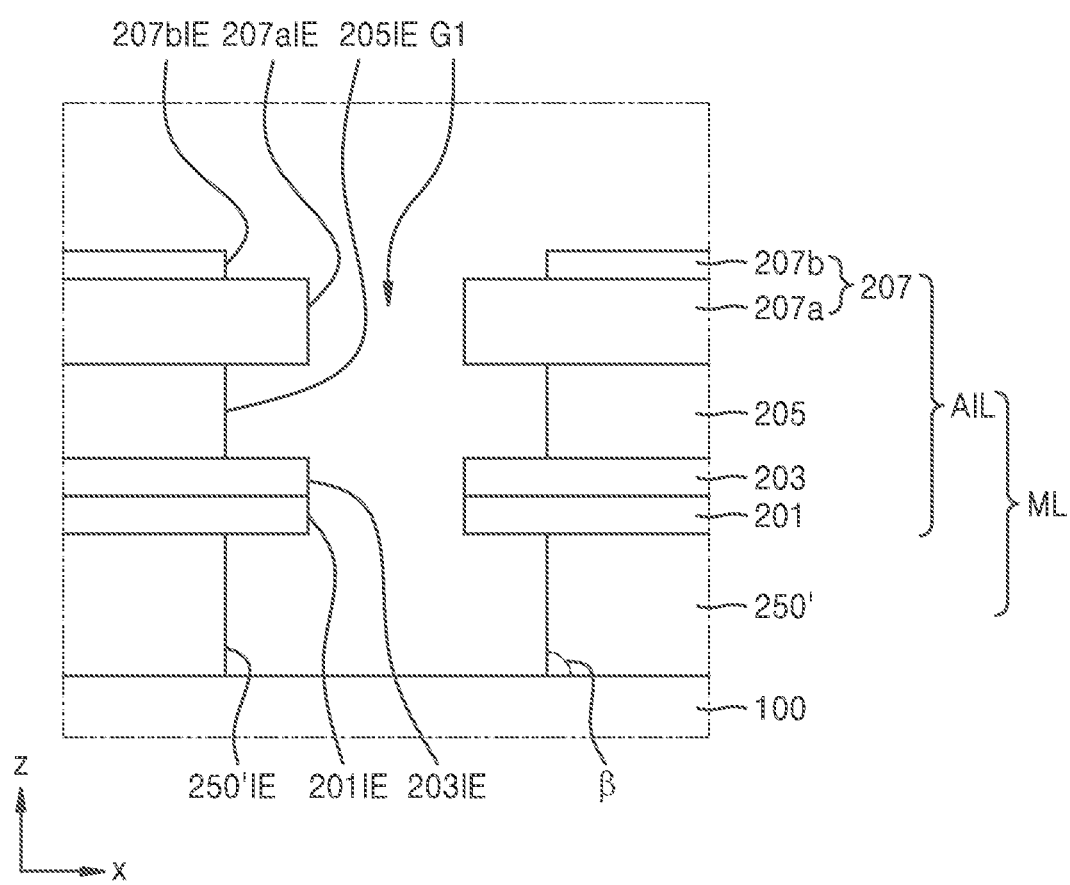
FIG. 15A is a cross-sectional view of a first groove according to another embodiment.
Figure 15B:
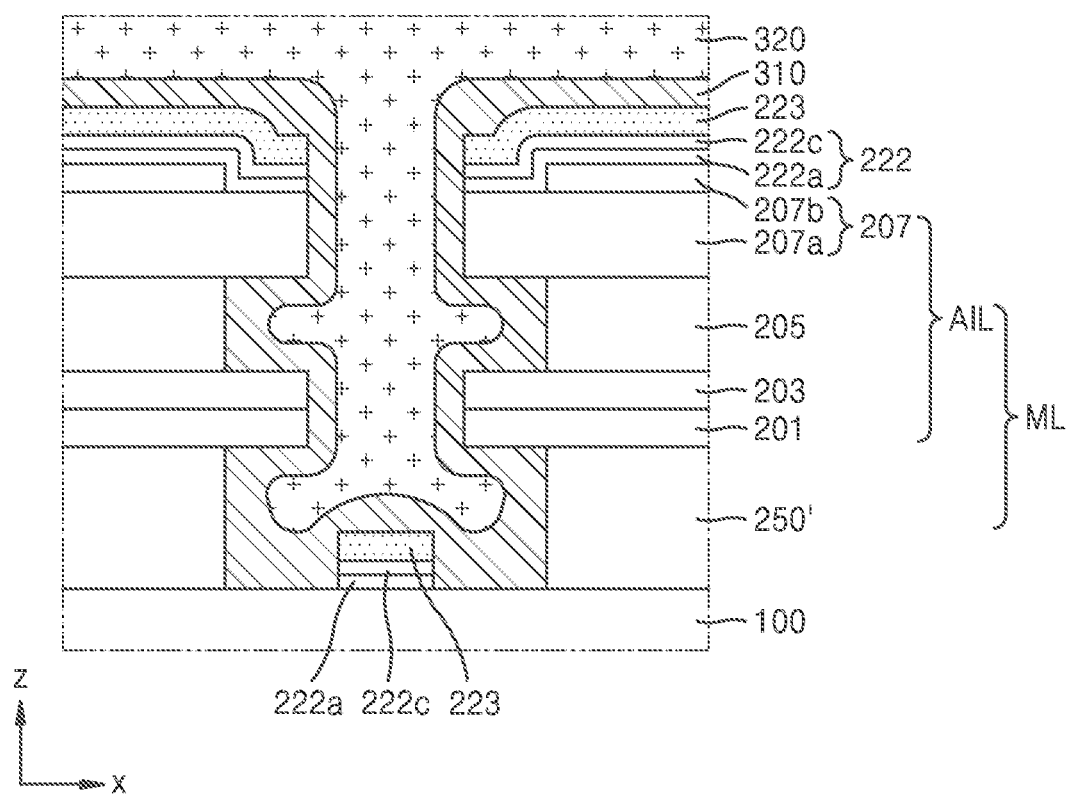
FIG. 15B is a cross-sectional view illustrating a stacked structure on the first groove of FIG. 15A.

FIG. 14 is a cross-sectional view of a display panel according to another embodiment, and corresponds to the cross-section taken along the line VII-VII' of FIG. 6. FIG. 15A is a cross-sectional view of a first groove G1 of the display panel of FIG. 14, and FIG. 15B is a cross-sectional view illustrating a stacked structure on the first groove G1 of FIG. 15A. The display panel of FIG. 14 is substantially the same as the display panel described above with reference to FIG. 7 and the like except for a lower insulating layer 250' and a structure of first and second grooves G1 and G2 based on the lower insulating layer 250', and thus mainly the difference between the two display panels will now be described.

The lower insulating layer 250' in the display panel of FIG. 14 may include an inorganic insulating layer. The lower insulating layer 250' may include an inorganic insulating layer that is different from the at least one insulating layer AIL. For example, the lower insulating layer 250' may include silicon nitride or silicon oxycarbide (SiOC).

The first and second grooves G1 and G2 may each be formed by etching the at least one insulating layer AIL and the lower insulating layer 250'. An etchant or an etch gas that is used during a process of etching the at least one insulating layer AIL may be the same as or different from an etchant or an etch gas that is used during a process of etching the lower insulating layer 250'.

According to an embodiment, when the lower insulating layer 250' includes silicon nitride or silicon oxycarbide (SiOC), the buffer layer 201, the gate insulating layer 203, and a lower second interlayer insulating layer 207a include silicon oxide, and the first interlayer insulating layer 205 and an upper second interlayer insulating layer 207b include silicon nitride, the amounts by which these layers are etched may be different from each other as shown in FIG. 15A.

The lateral surfaces 201IE and 203IE of the buffer layer 201 and the gate insulating layer 203 directly on the lower insulating layer 250' may protrude further toward the center of the first groove G1 than a lateral surface 250'IE of the lower insulating layer 250', thereby forming an undercut structure. A lateral surface 207aIE of the lower second interlayer insulating layer 207a may protrude further toward the center of the first groove G1 than the lateral surface 205IE of the first interlayer insulating layer 205, thereby having an undercut structure.

FIG. 15A illustrates a case where the second interlayer insulating layer 207 is a multi-layer having different materials and thus the lateral surfaces 207aIE and 207bIE of the upper and lower second interlayer insulating layers 207a and 207b form a step, but embodiments are not limited thereto. According to another embodiment, each of the buffer layer 201, the gate insulating layer 203, and the first interlayer insulating layer 205 may have a multi-layered structure having different materials. In this case, the at least one insulating layer AIL may locally have various shapes of undercut structures.

The lateral surface 250'IE of the lower insulating layer 250', which is an inorganic insulating layer, may have a larger inclination angle of β than an inclination angle of α of the lateral surface 250IE of the lower insulating layer 250, which is an organic insulating layer, as described above with reference to FIG. 9A. For example, the inclination angle of β of the lateral surface 250'IE of the lower insulating layer 250' may be 80° or greater or 85° or greater.

After the first groove G1 of FIG. 15A is formed, the intermediate layer 222, for example, the first and second functional layers 222a and 222c, and the opposite electrode 223 may be formed via deposition and may each be disconnected by the first groove G1. Thereafter, as described above with reference to FIGS. 7, 9B, and the like, the first inorganic encapsulation layer 310 and the organic encapsulation layer 320 are sequentially stacked on the opposite electrode 223.

FIG. 16 is a cross-sectional view of a display panel according to another embodiment, and corresponds to the cross-section taken along the line VII-VII' of FIG. 6. The display panel of FIG. 16 is substantially the same as the display panel of FIG. 14, and thus a difference therebetween will now be mainly described.

Referring to FIG. 16, first and second grooves G1 and G2 may be formed in the multi-layer ML, and bottom surfaces of the first and second grooves G1 and G2 may be on a virtual surface that is different from the upper surface of the substrate 100. The bottom surfaces of the first and second grooves G1 and G2 of FIG. 14 are arranged on the same virtual surface as the upper surface of the substrate 100, whereas the bottom surfaces of the first and second grooves G1 and G2 of FIG. 16 may be on a virtual surface that is over (e.g. above) the upper surface of the substrate 100 and is also under an upper surface of the lower insulating layer 250'.

Portions of the first and second grooves G1 and G2 in the lower insulating layer 250' are formed by partially etching the lower insulating layer 250', and thus a recess may be formed in the lower insulating layer 250' as described above with reference to FIG. 12A. A depth h of the recess may be less than a thickness t of the lower insulating layer 250'. For example, the depth h of the recess of the lower insulating layer 250' may be equal to or greater than 50%, 60%, 70%, 80%, 90%, 95%, or 97% of the thickness t of the lower insulating layer 250', but less than the thickness t of the lower insulating layer 250'.

Figure 17:
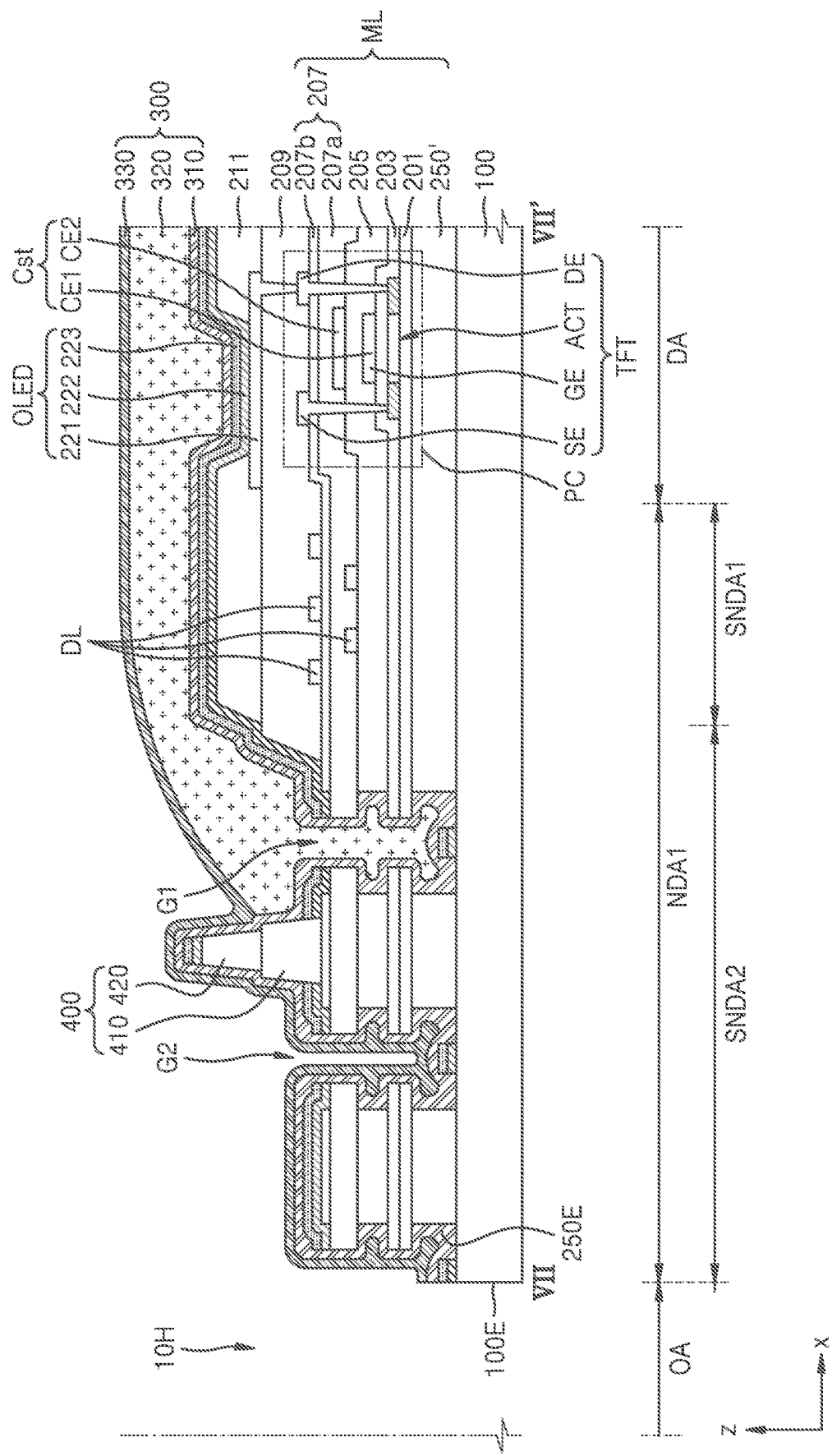
FIG. 17 is a cross-sectional view of a display panel according to another embodiment.

FIG. 17 is a schematic cross-sectional view of a display panel according to another embodiment. The display panel of FIG. 17 is substantially the same as the display panel of FIG. 14, and thus mainly a difference therebetween will now be described.

Referring to FIG. 17, the partition wall 400 may be between the first groove G1 and the second groove G2. The partition wall 400 includes the first and second sub-partition wall layers 410 and 420, and the material thereof has been described above with reference to FIG. 13. Because the partition wall 400 is able to control the flow of monomer during formation of the organic encapsulation layer 320, an end of the organic encapsulation layer 320 formed as the monomer is hardened may be arranged adjacent to one lateral surface of the partition wall 400. The end of the organic encapsulation layer 320 does not extend over the partition wall 400 toward the opening 10H. The partition wall 400 of FIG. 17 may also be included in the display panel of FIG. 16.

Figure 18:
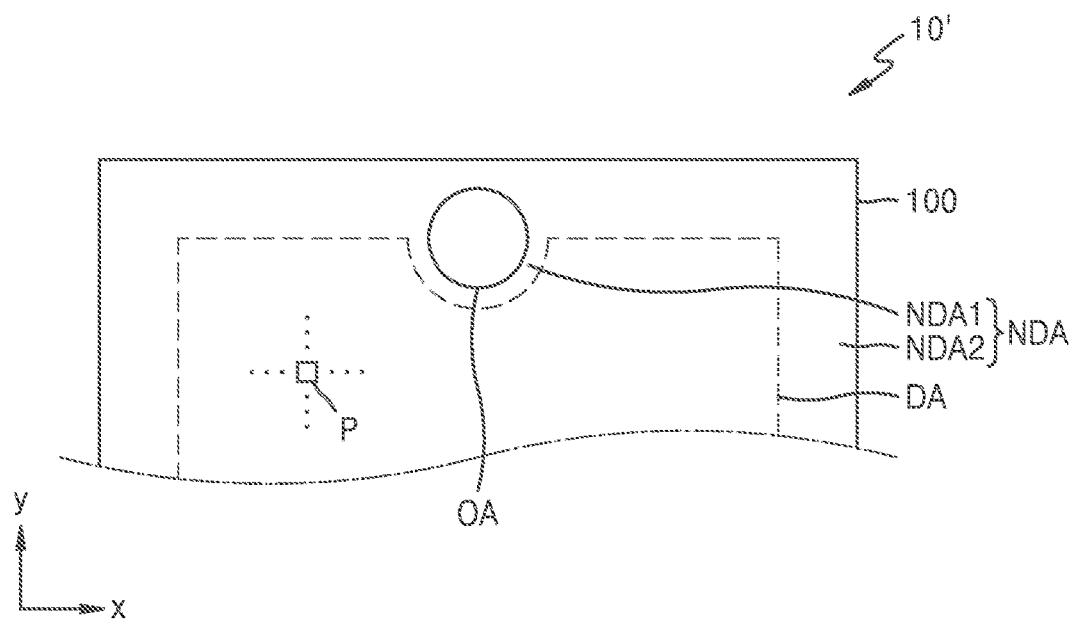
FIG. 18 is a plan view of a display panel according to another embodiment.
Figure 19:
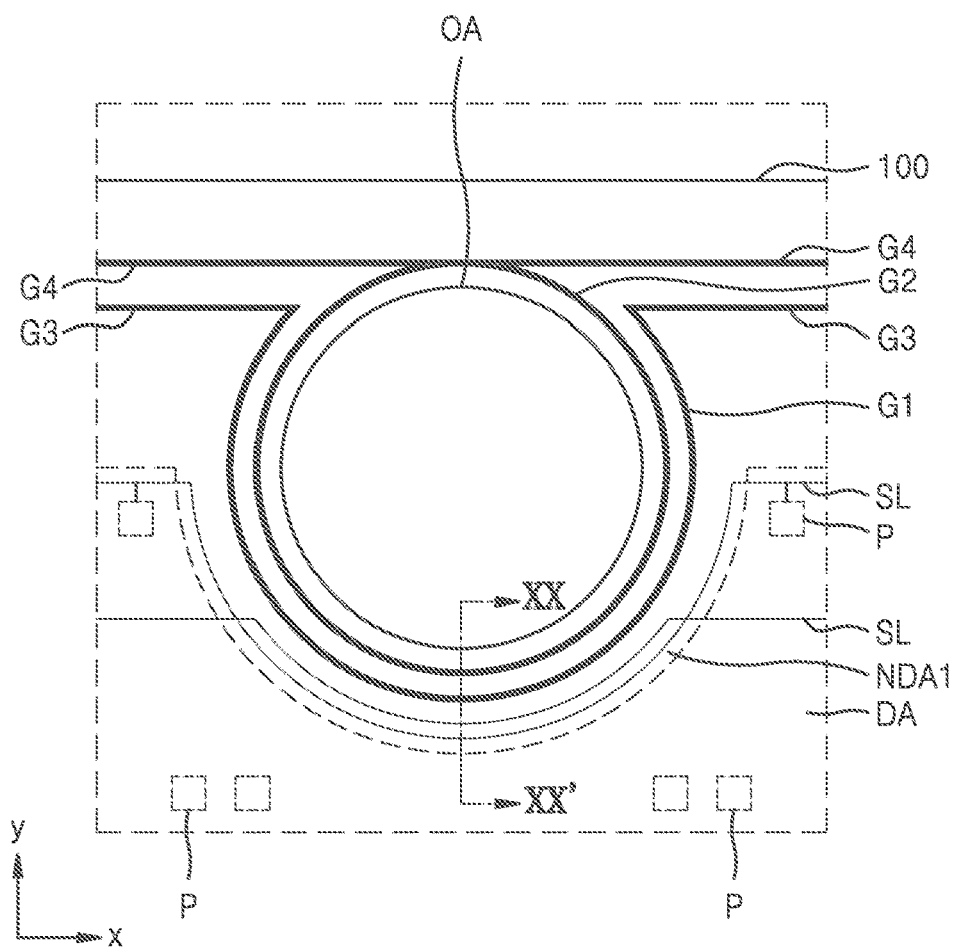
FIG. 19 is a plan view of surroundings of an opening area according to another embodiment.

FIG. 18 is a plan view of a display panel 10' according to another embodiment, and FIG. 19 is a plan view of the surroundings of an opening area OA of FIG. 18. Descriptions of components and structures of the display panel 10' of FIG. 18 that are the same as those of the display panel 10 of FIGS. 3 through 6 will not be repeated, and differences between the two display panels will now be focused on and described.

Referring to FIGS. 18 and 19, the opening area OA of the display panel 10' may be partially surrounded by the display area DA. Pixels P may be spaced apart from each other on left and right sides of the opening area OA. Scan lines SL that transfer scan signals to pixels P on the left side of the opening area OA and pixels P on the right side of the opening area OA may detour around the opening area OA in the first non-display area NDA1.

The opening area OA may be at least partially surrounded by the first and second grooves G1 and G2. According to an embodiment, FIG. 19 illustrates that the first groove G1 surrounds a portion of the opening area OA (e.g., the first groove G1 partially surrounds the opening area OA) and the second groove G2 entirely surrounds the entire opening area OA. When the first groove G1 surrounds a portion of the opening area OA, both ends of the first groove G1 may be connected to a third groove G3 located in the second non-display area NDA2. When the second groove G2 entirely surrounds the entire opening area OA, the second groove G2 may be connected to a fourth groove G4 located in the second non-display area NDA2. The third and fourth grooves G3 and G4 may extend along an edge of the substrate 100. Additionally, the third and fourth grooves G3 and G4 may be parallel to each other.

Figure 20:
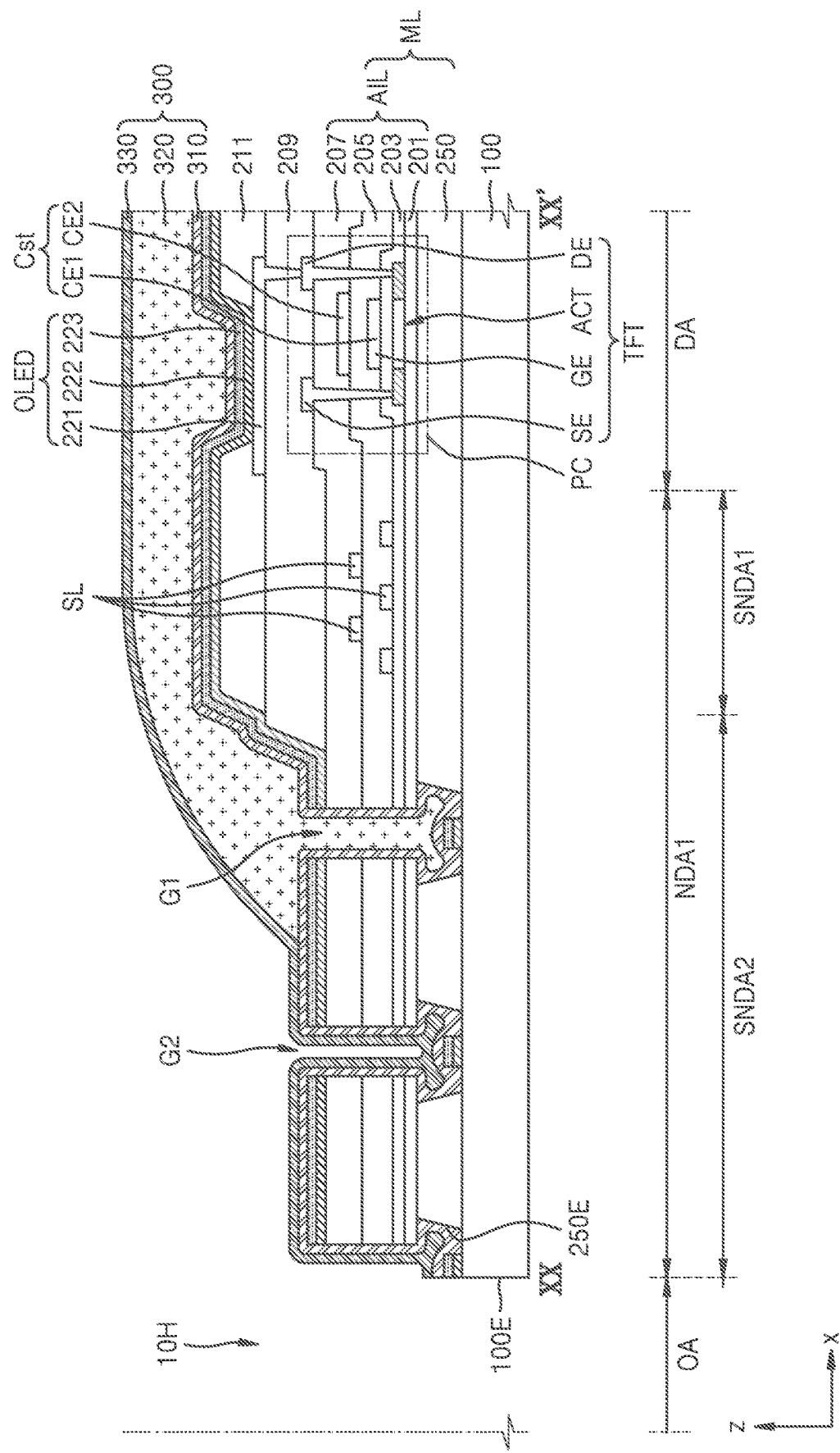
FIG. 20 is a cross-sectional view of the display panel of FIG. 19.

FIG. 20 is a cross-sectional view taken along a line XX-XX' of FIG. 18.

Referring to FIG. 20, scan lines SL located in the first sub-non-display area SNDA1 correspond to the scan lines SL that detour the opening area OA described with reference to FIG. 19. In FIG. 20, the scan lines SL are alternately arranged with an insulating layer (e.g., the first interlayer insulating layer 205) therebetween. In this case, a pitch between the scan lines SL may be reduced. According to another embodiment, the scan lines SL may be arranged on the same insulating layer.

The second sub-non-display area SNDA2 includes the first and second grooves G1 and G2. Although FIG. 20 illustrates that a structure of the first and second grooves G1 and G2 and components around the first and second grooves G1 and G2 are the same as those described with reference to FIG. 7, the second sub-non-display region SNDA2 may have a structure of the embodiment(s) described above with reference FIGS. 10A through 17 and structures derived therefrom.

Although not shown in FIG. 20, the third and fourth grooves G3 and G4 may have substantially the same cross-sectional structures as those of the first and second grooves G1 and G2. For example, each of the third and fourth grooves G3 and G4 may be formed to penetrate through the at least one insulating layer AIL and the lower insulating layer 250, thereby having an undercut structure.

Figure 21:
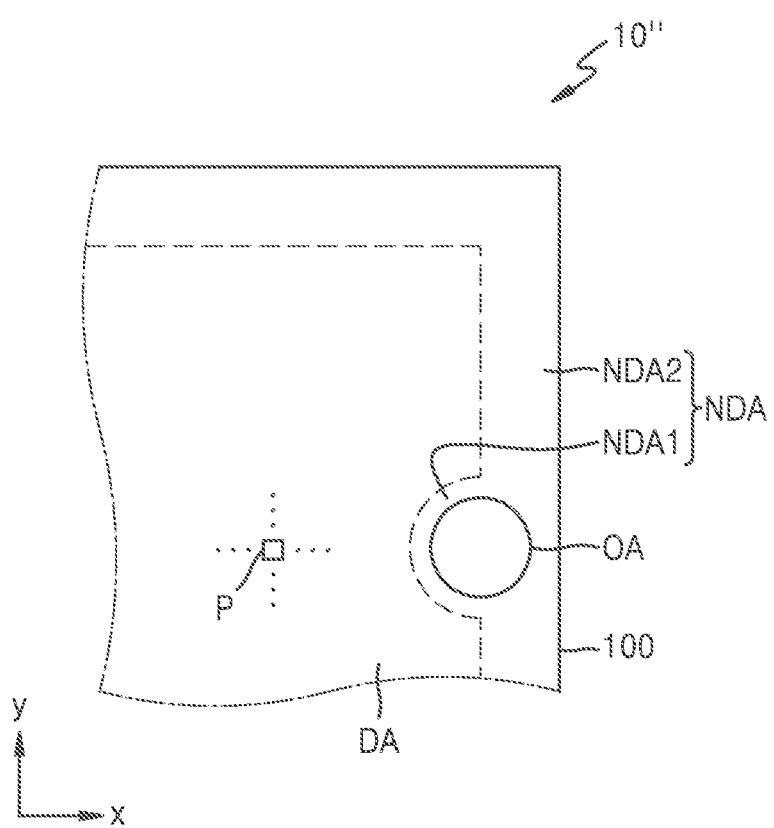
FIG. 21 is a plan view of a display panel according to another embodiment.
Figure 22:
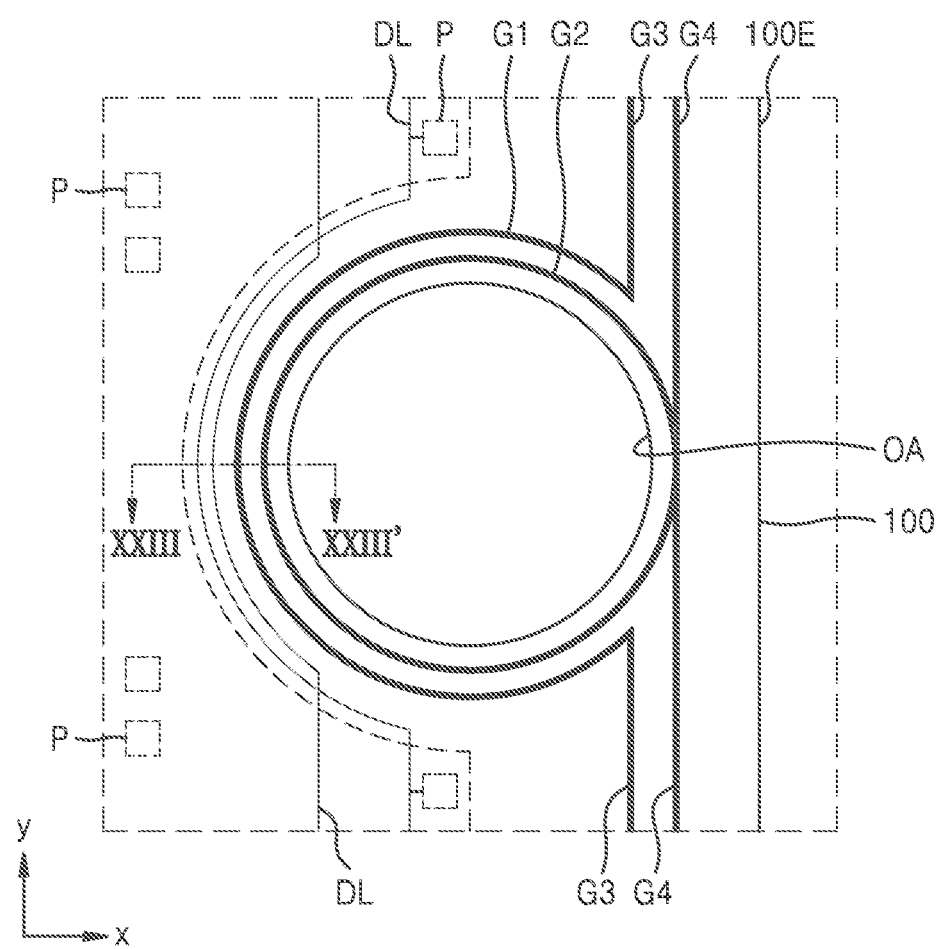
FIG. 22 is a plan view of surroundings of an opening area according to another embodiment.

FIG. 21 is a plan view of a display panel 10" according to another embodiment, and FIG. 22 is a plan view of surroundings of an opening area OA of FIG. 21. Descriptions of components and structures of the display panel 10" of FIG. 21 that are the same as those of the display panel 10 of FIGS. 3 through 6 will not be repeated, and differences therebetween will now be focused on and described.

Referring to FIGS. 21 and 22, the opening area OA of the display panel 10' may be partially surrounded by the display area DA. Pixels P may be spaced apart from each other on upper and lower sides of the opening area OA. Scan lines SL that transfer scan signals to pixels P on the upper side of the opening area OA and pixels P on the lower side of the opening area OA may detour around the opening area OA in the first non-display area NDA1.

The opening area OA may be at least partially surrounded by the first and second grooves G1 and G2. According to the embodiment illustrated in FIG. 22, the first groove G1 surrounds a portion of the opening area OA (e.g., the first groove G1 partially surrounds the opening area OA) and the second groove G2 entirely surrounds the entire opening area OA. When the first groove G1 surrounds a portion of the opening area OA, both ends of the first groove G1 may be connected to a third groove G3 located in the second non-display area NDA2. When the second groove G2 surrounds the entire opening area OA, the second groove G2 may be connected to a fourth groove G4 located in the second non-display area NDA2. The third and fourth grooves G3 and G4 may extend along an edge of the substrate 100. Additionally, the third and fourth grooves G3 and G4 may be parallel to each other.

FIG. 23 is a cross-sectional view taken along a line XXIII-XXIII' of FIG. 22.

Referring to FIG. 23, data lines DL located in the first sub-non-display area SNDA1 correspond to data lines that detour the opening area OA described with reference to FIG. 22. The second sub-non-display area SNDA2 includes the first and second grooves G1 and G2. Although a structure of the second sub-non-display area SNDA2 of FIG. 22 is the same as that described above with reference to FIG. 7, embodiments are not limited thereto. According to another embodiment, the second sub-non-display region SNDA2 may have the structure of the embodiment(s) described above with reference to FIGS. 10A through 17 and structures derived therefrom.

Although not shown in FIG. 23, the third and fourth grooves G3 and G4 may have substantially the same cross-sectional structures as those of the first and second grooves G1 and G2. For example, each of the third and fourth grooves G3 and G4 may be formed to penetrate through the at least one insulating layer AIL and the lower insulating layer 250, thereby having an undercut structure.

According to embodiments, a multi-layer is on a substrate, and a groove may be formed in the multi-layer including at least one insulating layer and a lower insulating layer. The groove can be formed regardless of a material of the substrate and may effectively block and prevent infiltration of moisture in a lateral direction. In one or more embodiments, in a display panel including a substrate that includes glass, polymer, or metal, because a groove having an undercut structure may be formed without removing the substrate, a material used to form the substrate may not be limited. However, the aforementioned effects are exemplary.

It should be understood that embodiments described herein should be considered in a descriptive sense only and not for purposes of limitation. Descriptions of features or aspects within each embodiment should typically be considered as available for other similar features or aspects in other embodiments.

While one or more embodiments have been described with reference to the figures, it will be understood by those of ordinary skill in the art that various changes in form and details may be made therein without departing from the spirit and scope as defined by the following claims.

What is claimed is:

1. A display device comprising:
   a substrate having an opening;
   a thin film transistor on a display area of the substrate and comprising a semiconductor layer and a gate electrode, the display area at least partially surrounding the opening;
   a display element electrically connected to the thin film transistor;
   a first groove in a non-display area between the opening of the substrate and the display area and defined in a multi-layer, the first groove having a shape concaved into the multi-layer, wherein the multi-layer comprises a lower layer on the substrate and at least one layer on the lower layer, and the at least one layer and the lower layer comprise materials that have different etch selectivities;
   a second groove in the non-display area and defined in the multi-layer, the second groove having a shape concaved into the multi-layer;
   a partition wall in the non-display area, wherein the partition wall is between the first groove and the second groove; and
   an encapsulation layer covering the display element and comprising a first inorganic encapsulation layer, an organic encapsulation layer, and a second inorganic encapsulation layer,
   wherein the display element comprises a pixel electrode, an opposite electrode, and an intermediate layer between the pixel electrode and the opposite electrode, and
   wherein at least one organic layer of the intermediate layer has a plurality of portions that are separated from each other by the first groove.

2. The display device of claim 1, wherein the at least one layer has a tip that protrudes toward the first groove beyond a point at which a lateral surface of the lower layer and a bottom surface of the at least one layer meet.

3. The display device of claim 2, wherein the first inorganic encapsulation layer extends to the non-display area and overlaps an upper surface, a lateral surface, the bottom surface of the at least one layer, and a portion of the lateral surface of the lower layer.

4. The display device of claim 1, wherein the first groove is located between the display area and the partition wall, and the second groove is located between the partition wall and the opening of the substrate.

5. The display device of claim 1, wherein the first groove is at least partially filled with a portion of the organic encapsulation layer.

6. The display device of claim 1, wherein the plurality of portions of the at least one organic layer of the intermediate layer comprises a first portion that is in the first groove and a second portion on the multi-layer and separated from the first portion of the at least one organic layer.

7. The display device of claim 1, wherein the opposite electrode has a plurality of portions that are separated from each other by the first groove, and
   wherein the plurality of portions of the opposite electrode comprises a first portion that is in the first groove and a second portion on the multi-layer and separated from the first portion of the opposite electrode.

8. The display device of claim 1, further comprising a signal line electrically connected to the thin film transistor, wherein a portion of signal line is in the display area and another portion of the signal line is in the non-display area, and the other portion of the signal line detours along a periphery of the opening of the substrate in a plan view.

9. The display device of claim 8, wherein the signal line comprises a data line or a scan line.

10. The display device of claim 8, wherein the other portion of the signal line is located between the first groove and the display area.

11. The display device of claim 1, wherein a portion of the second inorganic encapsulation layer is in contact with a portion of the first inorganic encapsulation layer in the second groove.

12. A display device comprising:
    a substrate having an opening;
    a thin film transistor on a display area of the substrate and comprising a semiconductor layer and a gate electrode, the display area at least partially surrounding the opening;
    a display element electrically connected to the thin film transistor;
    a first groove in a non-display area between the opening of the substrate and the display area and defined in a multi-layer, the first groove having a shape concaved into the multi-layer, wherein the multi-layer comprises a lower layer on the substrate and at least one layer on the lower layer, and the at least one layer and the lower layer comprise materials that have different etch selectivities;
    a partition wall in the non-display area, wherein the partition wall is between the first groove and the opening of the substrate; and
    an encapsulation layer covering the display element and comprising a first inorganic encapsulation layer, an organic encapsulation layer, and a second inorganic encapsulation layer,
    wherein the at least one layer has a tip that protrudes toward the first groove beyond a point at which a lateral surface of the lower layer facing the first groove and a bottom surface of the at least one layer meet, and
    wherein the first inorganic encapsulation layer extends to the non-display area and overlaps an upper surface, a lateral surface, the bottom surface of the at least one layer, and a portion of the lateral surface of the lower layer.

13. The display device of claim 12, wherein the first groove is at least partially filled with a portion of the organic encapsulation layer.

14. The display device of claim 12, further comprising a second groove in the non-display area and defined in the multi-layer, the second groove having a shape concaved into the multi-layer, wherein the first groove is located between the display area and the partition wall, and the second groove is located between the partition wall and the opening of the substrate.

15. The display device of claim 14, wherein a portion of the second inorganic encapsulation layer is in contact with a portion of the first inorganic encapsulation layer in the second groove.

16. The display device of claim 14, wherein the at least one layer has a second tip that protrudes toward the second groove beyond a point at which a lateral surface of the lower layer facing the second groove and a bottom surface of the at least one layer meet.

17. The display device of claim 12, wherein the display element comprises a pixel electrode, an opposite electrode, and an intermediate layer between the pixel electrode and the opposite electrode, and wherein at least one organic layer of the intermediate layer has a plurality of portions that are separated from each other by the first groove.

18. The display device of claim 17, wherein the opposite electrode has a plurality of portions that are separated from each other by the first groove.

19. The display device of claim 12, wherein further comprising a signal line electrically connected to the thin film transistor, wherein a portion of signal line is in the display area and an other portion of the signal line is in the non-display area, and the other portion of the signal line detours along a periphery of the opening of the substrate in a plan view.

20. The display device of claim 19, wherein the signal line comprises a data line or a scan line.

21. The display device of claim 19, wherein the other portion of the signal line is located between the first groove and the display area.

22. The display device of claim 19, further comprising a second signal line adjacent to the signal line, wherein a portion of the second signal line, which is in the non-display area, is above an insulation layer and the other portion of the signal line is below the insulation layer.

* * * * *